(12) United States Patent
Chu et al.

(10) Patent No.: US 11,721,683 B2
(45) Date of Patent: Aug. 8, 2023

(54) MASK TRANSFER METHOD (AND RELATED APPARATUS) FOR A BUMPING PROCESS

(71) Applicant: Taiwan Semiconductor Manufacturing Company, Ltd., Hsin-Chu (TW)

(72) Inventors: Ching-Sheng Chu, Baoshan Township (TW); Chern-Yow Hsu, Chu-Bei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/680,220

(22) Filed: Feb. 24, 2022

(65) Prior Publication Data

US 2022/0181312 A1 Jun. 9, 2022

Related U.S. Application Data

(62) Division of application No. 16/841,978, filed on Apr. 7, 2020, now Pat. No. 11,264,368.
(Continued)

(51) Int. Cl.
*H01L 25/16* (2023.01)
*H01L 33/00* (2010.01)
*H01L 33/62* (2010.01)

(52) U.S. Cl.
CPC ........ *H01L 25/167* (2013.01); *H01L 33/0093* (2020.05); *H01L 33/0095* (2013.01); *H01L 33/62* (2013.01); *H01L 2933/0066* (2013.01)

(58) Field of Classification Search
None
See application file for complete search history.

(56) References Cited

U.S. PATENT DOCUMENTS 9,129,963 B1 9/2015 Yang
11,264,368 B2 * 3/2022 Chu .................... H01L 33/0093
(Continued)

FOREIGN PATENT DOCUMENTS

KR 20120007699 A 1/2012

OTHER PUBLICATIONS

Notice of Allowance dated Oct. 20, 2021 for U.S. Appl. No. 16/841,978.

*Primary Examiner* — Robert K Carpenter
(74) *Attorney, Agent, or Firm* — Eschweiler & Potashnik, LLC

(57) ABSTRACT

Various embodiments of the present disclosure are directed towards an integrated chip (IC). The IC includes a first dielectric structure having first inner sidewalls over an interlayer dielectric (ILD) structure. A second dielectric structure is over the first dielectric structure, where the first inner sidewalls are between second inner sidewalls of the second dielectric structure. A sidewall barrier structure is over the first dielectric structure and extends vertically along the second inner sidewalls. A lower bumping structure is between the second inner sidewalls and extends vertically along the first inner sidewalls and vertically along third inner sidewalls of the sidewall barrier structure. An upper bumping structure is over both the lower bumping structure and the sidewall barrier structure and between the second inner sidewalls, where an uppermost point of the upper bumping structure is at or below an uppermost point of the second dielectric structure.

20 Claims, 26 Drawing Sheets

Related U.S. Application Data

(60) Provisional application No. 62/892,646, filed on Aug. 28, 2019.

(56) References Cited

U.S. PATENT DOCUMENTS

| | | |
|---|---|---|
| 2010/0140805 A1 | 6/2010 | Chang et al. |
| 2013/0127045 A1 | 5/2013 | Lin et al. |
| 2013/0168848 A1 | 7/2013 | Lin et al. |
| 2015/0111342 A1 | 4/2015 | Lin et al. |
| 2018/0151527 A1 | 5/2018 | Chang et al. |
| 2019/0027450 A1 | 1/2019 | Choi et al. |

* cited by examiner

MASK TRANSFER METHOD (AND RELATED APPARATUS) FOR A BUMPING PROCESS

REFERENCE TO RELATED APPLICATIONS

This Application is a Divisional of U.S. application Ser. No. 16/841,978, filed on Apr. 7, 2020, which claims the benefit of U.S. Provisional Application No. 62/892,646, filed on Aug. 28, 2019. The contents of the above-referenced Patent Applications are hereby incorporated by reference in their entirety.

BACKGROUND

During the bulk manufacture of an integrated circuit (IC), a plurality of IC dies are formed on a semiconductor wafer. After forming the IC dies, the IC dies are separated and packaged. Wafer-level packaging (WLP) is a packaging process in which the IC dies are packaged before separation. Some types of WLP may include, for example, flip chip packaging, chip-scale packaging (CSP), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
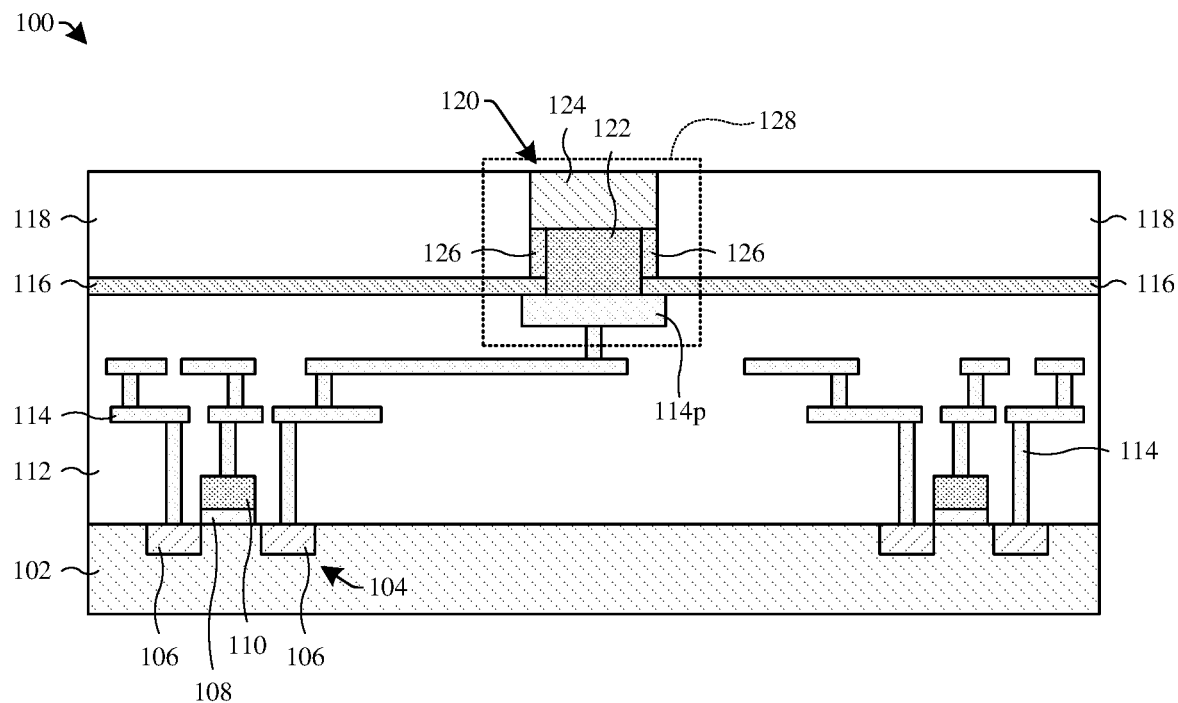
FIG. 1 illustrates a cross-sectional view of some embodiments of an integrated circuit (IC) having a bumping structure.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some packaging processes using a nickel/gold (Ni/Au) bumping process, a first dielectric layer (e.g., silicon nitride (SiN)) is formed covering a copper pad, and a second dielectric layer (e.g., silicon dioxide (SiO$_2$)) is formed covering the first dielectric layer. A first etch is performed into the second dielectric layer. The first etch stops on the first dielectric layer and forms a first opening overlying the copper pad. Thereafter, a metal comprising sidewall barrier structure (e.g., titanium nitride (TiN)) is formed lining sidewalls of the first opening. A second etch is then performed into the first dielectric layer. The second etch forms a second opening that exposes the copper pad and that is laterally spaced between sidewalls of the first opening. A Ni/Au bump is formed on the copper pad and along the metal comprising sidewall barrier structure. The Ni/Au bump comprises a nickel layer on the copper pad, and a gold layer overlying the nickel layer. The metal comprising sidewall barrier structure blocks or otherwise slows movement (e.g., diffusion) of copper from the copper pad to the gold layer along sidewalls of the nickel layer. This prevents the copper from contaminating the gold layer, which may negatively impact yield during bulk manufacture and/or packaging of an IC using the packaging processes.

A challenge with the packaging processes is that the Ni/Au bump may extend vertically over an upper surface of the second dielectric layer. The Ni/Au bump may vertically extend over the upper surface of the second dielectric layer, for example, due to the gold layer over-plating on the metal comprising sidewall barrier structure. Due to a height of the metal comprising sidewall barrier structure, the over-plating of the gold layer on the metal comprising barrier structure may result in the gold layer vertically extending over the upper surface of the second dielectric layer. In some embodiments, the over-plating results in a "fence" structure (e.g., an outer ring-like portion) that vertically extends over the upper surface of the second dielectric layer and overlies the metal comprising sidewall barrier structure. Because the Ni/Au bump extends vertically over the second dielectric layer, bondability of the Ni/Au bump and/or the second dielectric layer to a transparent screen panel (e.g., a glass screen panel) and/or a carrier substrate (e.g., carrier wafer) may be negatively impacted (e.g., due to seams (e.g., voids) between the carrier substrate and the Ni/Au bump and/or second dielectric layer). Accordingly, the Ni/Au bump extending vertically over the upper surface of the second dielectric layer may lead to a low yield during the bulk manufacture and/or packaging of an IC using the packaging processes.

Various embodiments of the present application are directed toward a mask transfer method for a bumping process (e.g., Ni/Au bumping process), as well as a related apparatus. In some embodiments, the method comprises receiving a workpiece comprising a first dielectric layer covering a conductive pad and a second dielectric layer covering the first dielectric layer. A first opening is formed in the second dielectric layer and at least partially between sidewalls of the conductive pad. A sidewall barrier structure is formed over the first dielectric layer and along sidewalls of the first opening. A hardmask layer is formed lining the second dielectric layer, the sidewall barrier structure, and a portion of the first dielectric layer disposed between inner sidewalls of the sidewall barrier structure. A masking layer is formed lining the hardmask layer and filing the first opening.

An upper portion of the masking layer is removed, such that a lower portion of the masking layer is disposed in the first opening and has an upper surface disposed between an upper surface of the second dielectric layer and an upper surface of the first dielectric layer. Thereafter, an upper portion of the hardmask layer is removed, such that a lower portion of the hardmask layer is disposed in the first opening and has an upper surface that is substantially aligned with the upper surface of the lower portion of the masking layer. An upper portion of the sidewall barrier structure is then removed, such that a lower portion of the sidewall barrier structure has an upper surface disposed beneath the upper surface of the second dielectric layer and spaced from the upper surface of the second dielectric layer by a non-zero distance.

Thereafter, the lower portion of the hardmask layer and the lower portion of the masking layer are removed. A second opening is then formed in the first dielectric layer to expose the conductive pad. The second opening is formed between the sidewalls of the first opening. A lower bumping structure is then formed on the conductive layer and at least partially along the inner sidewalls of the lower portion of the sidewall barrier structure. An upper bumping structure is then formed covering the lower bumping structure and the sidewall barrier structure. Because the upper surface of the lower portion of the sidewall barrier structure is disposed beneath the upper surface of the second dielectric layer and spaced from the upper surface of the second dielectric layer by the non-zero distance, a height of the lower portion of the sidewall barrier structure may prevent the upper bumping structure from vertically extending over the upper surface of the second dielectric layer (e.g., the height of the lower portion of the sidewall barrier structure being such that over-plating on the lower portion of the sidewall barrier structure does not result in the upper bumping structure extending vertically over the upper surface of the second dielectric structure). Thus, the upper bumping structure may not be formed with a "fence" structure that vertically extends over the upper surface of the second dielectric layer. Accordingly, the mask transfer method for the bumping process may improve yield during bulk manufacture and/or the packaging of ICs.

FIG. 1 illustrates a cross-sectional view of some embodiments of an integrated circuit (IC) 100 having a bumping structure.

The IC 100 comprises a semiconductor substrate 102. The semiconductor substrate 102 may comprise any type of semiconductor body (e.g., monocrystalline silicon/CMOS bulk, silicon-germanium (SiGe), silicon on insulator (SOI), etc.). One or more semiconductor devices 104 may be disposed on/in the semiconductor substrate 102. The one or more semiconductor devices 104 may be or comprise, for example, metal-oxide-semiconductor (MOS) field-effect transistors (FETs), some other MOS devices, or some other semiconductor devices. For example, the one or more semiconductor devices 104 may be a MOSFET comprising a pair of source/drain regions 106 disposed in the semiconductor substrate 102, a gate dielectric 108 disposed over the semiconductor substrate 102 and between the source/drain regions 106, and a gate electrode 110 disposed over the gate dielectric 108 and between the source/drain regions 106.

An interlayer dielectric (ILD) structure 112 is disposed over the semiconductor substrate 102 and the one or more semiconductor devices 104. In some embodiments, the ILD structure 112 comprises one or more stacked ILD layers, which may respectively comprise a low-k dielectric (e.g., a dielectric material with a dielectric constant less than about 3.9), an oxide (e.g., silicon dioxide ($SiO_2$)), or the like. An interconnect structure 114 (e.g., copper interconnect) is embedded in the ILD structure 112. The interconnect structure 114 comprises a plurality of first conductive features (e.g., metal lines, metal vias, metal contacts, etc.). The interconnect structure 114 is configured to electrically couple the one or more semiconductor devices 104 together. In some embodiments, the interconnect structure 114 may comprise, for example, copper (Cu), aluminum (Al), tungsten (W), some other conductive material, or a combination of the foregoing.

The interconnect structure 114 comprises an upper conductive pad 114p. In some embodiments, the upper conductive pad 114p is an uppermost first conductive feature of the interconnect structure 114. In further embodiments, the upper conductive pad 114p is a copper pad. It will be appreciated that, in some embodiments, the upper conductive pad 114p is one of a plurality of upper conductive pads that have substantially co-planar upper surfaces. In such embodiments, the plurality of upper conductive pads may be uppermost first conductive features of the interconnect structure 114, and the upper conductive pad 114p is one of the uppermost first conductive features.

A first dielectric structure 116 is disposed over the interconnect structure 114 and the ILD structure 112. In some embodiments, the first dielectric structure 116 comprises a nitride (e.g., silicon nitride (SiN)), an oxide (e.g., $SiO_2$), an oxy-nitride (e.g., silicon oxy-nitride ($SiO_XN_Y$)), or the like. A second dielectric structure 118 is disposed over the first dielectric structure 116, the interconnect structure 114, and the ILD structure 112. In some embodiments, the second dielectric structure 118 comprises an oxide (e.g., $SiO_2$), a nitride (e.g., SiN), an oxy-nitride (e.g., $SiO_XN_Y$), or the like. In further embodiments, the second dielectric structure 118 comprises a different dielectric material than the first dielectric structure 116. In yet further embodiments, the second dielectric structure 118 is $SiO_2$ and the first dielectric structure 116 is SiN.

A bumping structure 120 is disposed over the interconnect structure 114 and the ILD structure 112. The bumping structure comprises a lower bumping structure 122 and an upper bumping structure 124. In some embodiments, the bumping structure 120 is disposed directly over the upper conductive pad 114p.

The lower bumping structure 122 is vertically disposed between the upper bumping structure 124 and the upper conductive pad 114p. The lower bumping structure 122 is electrically coupled to the interconnect structure 114. The lower bumping structure 122 extends vertically through the first dielectric structure 116. The lower bumping structure 122 may extend vertically through the first dielectric structure 116 and contact the upper conductive pad 114p. The lower bumping structure 122 is at least partially disposed in the second dielectric structure 118. In some embodiments, outer sidewalls of the lower bumping structure 122 are disposed within outer sidewalls of the upper conductive pad 114p. An upper surface of the lower bumping structure 122 is disposed vertically between an upper surface of the second dielectric structure 118 and a lower surface of the second dielectric structure 118. In some embodiments, the upper surface of the lower bumping structure 122 is an uppermost surface of the lower bumping structure 122. In further embodiments, the upper surface of the second dielectric structure 118 is an uppermost surface of the second dielectric structure 118, and the lower surface of the second dielectric structure 118 is the lowermost surface of the second dielectric structure 118.

A first sidewall barrier structure 126 is disposed in the second dielectric structure 118 and along the outer sidewalls of the lower bumping structure 122. The first sidewall barrier structure 126 is configured to block or otherwise slows movement (e.g., diffusion) of atoms from the upper conductive pad 114p to the upper bumping structure 124 along sidewalls of the lower bumping structure 122. In some embodiments, the first sidewall barrier structure 126 is disposed directly over the upper conductive pad 114p.

The first sidewall barrier structure 126 is vertically disposed between the upper bumping structure 124 and the first dielectric structure 116. In some embodiments, outer sidewalls of the first sidewall barrier structure 126 are disposed within the outer sidewalls of the upper conductive pad 114p. In further embodiments, inner sidewalls of the first sidewall barrier structure 126 are substantially aligned with inner sidewalls of the first dielectric structure 116. The first dielectric structure 116 vertically separates the first sidewall barrier structure 126 from the upper conductive pad 114p. An upper surface of the first sidewall barrier structure 126 is disposed vertically between the upper surface of the second dielectric structure 118 and the lower surface of the second dielectric structure 118. In some embodiments, the upper surface of the first sidewall barrier structure 126 is substantially co-planar with the upper surface of the lower bumping structure 122. In further embodiments, the upper surface of the first sidewall barrier structure 126 is an uppermost surface of the first sidewall barrier structure 126.

The upper bumping structure 124 is disposed in the second dielectric structure 118 and over both the lower bumping structure 122 and the first sidewall barrier structure 126. The upper bumping structure 124 may cover the lower bumping structure 122 and/or the first sidewall barrier structure 126. In some embodiments, an uppermost point of the upper bumping structure 124 is disposed at or below an uppermost point of the second dielectric structure 118. In further embodiments, the upper bumping structure 124 has a substantially planar upper surface. Because the uppermost point of the upper bumping structure 124 is disposed at or below an uppermost point of the second dielectric structure 118, the upper surface of the upper bumping structure 124 does not have a "fence" structure that extends over the upper surface of the second dielectric structure 118. Accordingly, the bumping structure 120 may improve the ability of the IC 100 to be bonded (e.g., bondability) to a transparent screen panel (e.g., a glass screen panel) and/or a carrier substrate (e.g., carrier wafer).

Figure 2:
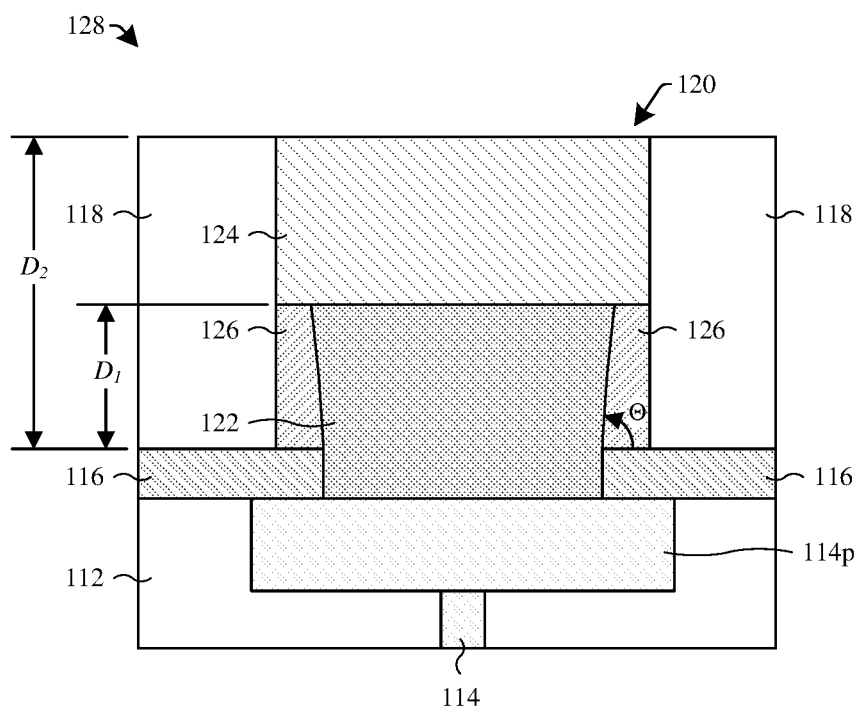
FIG. 2 illustrate an enlarged cross-sectional view of some embodiments of an area of FIG. 1.

FIG. 2 illustrate an enlarged cross-sectional view of some embodiments of an area 128 (see, e.g., FIG. 1) of FIG. 1.

As shown in FIG. 2, the first sidewall barrier structure 126 extends vertically a first distance $D_1$ from the upper surface of the first dielectric structure 116 toward the upper surface of the second dielectric structure 118. The upper surface of the second dielectric structure 118 is vertically spaced from the upper surface of the first dielectric structure 116 by a second distance $D_2$. The first distance $D_1$ is less than the second distance $D_2$. In some embodiments, the first distance $D_1$ is between ten percent and fifty percent of the second distance $D_2$. If the first distance $D_1$ is greater than fifty percent of the second distance $D_2$, the uppermost point of the upper bumping structure 124 may extend vertically over the uppermost point of the second dielectric structure 118 causing the upper bumping structure 124 to have a "fence" that vertically extends over the upper surface of the second dielectric structure 118 (e.g., due to the process for forming the upper bumping structure 124 over-plating on the upper surface of the first sidewall barrier structure 126). On the other hand, if the first distance $D_1$ is less than ten percent of the second distance $D_2$, the uppermost point of the upper bumping structure 124 may be disposed too far below the uppermost point of the second dielectric structure 118 causing the upper bumping structure 124 to have a severe "hump" (e.g., a raised portion of the upper bumping structure disposed directly over the lower bumping structure 122) that vertically extends over the upper surface of the second dielectric structure 118. In some embodiments, the first sidewall barrier structure 126 contacts the first dielectric structure 116, the lower bumping structure 122, the upper bumping structure 124, and the second dielectric structure 118.

In some embodiments, the first sidewall barrier structures 126 has arced inner sidewalls. The arced inner sidewalls of the first sidewall barrier structure 126 may arc from a lower surface of the first sidewall barrier structure 126 to the upper surface of the first sidewall barrier structure 126. The arced inner sidewalls of the first sidewall barrier structure 126 may arc towards the outer sidewalls of the first sidewall barrier structure 126 from the lower surface of the first sidewall barrier structure 126 to the upper surface of the first sidewall barrier structure 126. In other embodiments, the inner sidewalls of the first sidewall barrier structure 126 may be substantially vertical. In further embodiments, the lower surface of the first sidewall barrier structure 126 is a lowermost surface of the first sidewall barrier structure 126.

The second dielectric structure 118 has inner sidewalls. In some embodiments, the inner sidewalls of the second dielectric structure 118 are substantially vertical. The inner sidewalls of the second dielectric structure 118 have a first lower portion and a first upper portion disposed over the first lower portion. In some embodiments, the outer sidewalls of the first sidewall barrier structure 126 engage the first lower portion of the inner sidewalls of the second dielectric structure 118. The outer sidewalls of the first sidewall barrier structure 126 extend vertically along the first lower portion of the inner sidewalls of the second dielectric structure 118. In further embodiments, the outer sidewalls of the first sidewall barrier structure 126 are substantially vertical. In yet further embodiments, the first lower portion is defined by lower portions of the inner sidewalls of the second dielectric structure 118 that extend vertically from the lower surface of the second dielectric structure 118 to the upper surface of the first sidewall barrier structure 126. The first upper portion is defined by upper portions of the inner sidewalls of the second dielectric structure 118 that extend vertically from the lower portions of the inner sidewalls of the second dielectric structure 118 to the upper surface of the second dielectric structure 118.

An angle $\Theta$ exists between one of the inner sidewalls of the first sidewall barrier structure 126 and the lower surface of the first sidewall barrier structure 126. In some embodiments, the angle $\Theta$ is between twenty degrees and ninety degrees. In further embodiments, the angle $\Theta$ is substantially the same between each of the inner sidewalls of the first sidewall barrier structure 126 and the lower surface of the first sidewall barrier structure 126.

In some embodiments, an outermost perimeter of the first sidewall barrier structure 126 is disposed within an outermost perimeter of the upper conductive pad 114*p*. In other embodiments, the outermost perimeter of the first sidewall barrier structure 126 may be at least partially disposed outside the outermost perimeter of the upper conductive pad 114*p*. In such embodiments, one or more outer sidewalls of the outer sidewalls of the upper conductive pad 114*p* are disposed within the outer sidewalls of the first sidewall barrier structure 126.

In some embodiments, the upper surface of the first sidewall barrier structure 126 is substantially planar. In further embodiments, the upper surface of the first sidewall barrier structure 126 laterally surrounds the lower bumping structure 122. In such embodiments, the upper surface extends laterally around the lower bumping structure 122 in a continuous closed path. In further embodiments, the first sidewall barrier structure 126 comprises, for example, titanium (Ti), titanium nitride (TiN), some other material that sufficiently blocks diffusion of atoms from the upper conductive pad 114*p* to the upper bumping structure 124, or a combination of the foregoing.

The lower bumping structure 122 is disposed between the inner sidewalls of the first sidewall barrier structure 126 and between inner sidewalls of the first dielectric structure 116. In some embodiments, the inner sidewalls of the first dielectric structure 116 are substantially vertical. In further embodiments, the inner sidewalls of the first dielectric structure 116 are disposed between the inner sidewalls of the second dielectric structure 118. The upper conductive pad 114*p* is at least partially disposed between the inner sidewalls of the first dielectric structure 116.

In some embodiments, the lower bumping structure 122 contacts both the first dielectric structure 116 and the first sidewall barrier structure 126. In further embodiments, a lower surface of the lower bumping structure 122 is substantially co-planar with a lower surface of the first dielectric structure 116. In further embodiments, the lower bumping structure 122 comprises, for example, pure nickel (Ni), a Ni alloy, some other suitable metal, or a combination of the foregoing. In yet further embodiments, the lower surface of the lower bumping structure 122 is a lowermost surface of the lower bumping structure 122.

The outer sidewalls of the lower bumping structure 122 has a second lower portion and a second upper portion disposed over the second lower portion. In some embodiments, the second lower portion of the outer sidewalls of the lower bumping structure 122 engage the inner sidewalls of the first dielectric structure 116. The second lower portion is defined by lower portions of the outer sidewalls of the lower bumping structure 122 that extend vertically from the lower surface of the lower bumping structure 122 to the upper surface of the first dielectric structure 116. In further embodiments, the lower portions of the outer sidewalls of the lower bumping structure 122 are substantially vertical.

The second upper portion of the outer sidewalls of the lower bumping structure 122 engage the inner sidewalls of the first sidewall barrier structure 126. The second upper portion is defined by upper portions of the outer sidewalls of the lower bumping structure 122 that extend vertically from the lower portions of the outer sidewalls of the lower bumping structure 122 to the upper surface of the lower bumping structure 122. In some embodiments, the upper portions of the outer sidewalls of the lower bumping structure 122 are arced. In further embodiments, the arced upper portions of the outer sidewalls of the lower bumping structure 122 arc toward the outer sidewalls of the first sidewall barrier structure 126 from the lower portions of the outer sidewalls of the lower bumping structure 122 to the upper surface of the lower bumping structure 122. In yet further embodiments, the arced outer sidewalls of the lower bumping structure 122 may arc so that at least a portion of the arced outer sidewalls of the lower bumping structure 122 are disposed outside the inner sidewalls of the first dielectric structure 116. In other embodiments, the upper portions of the outer sidewalls of the lower bumping structure 122 are substantially vertical.

In some embodiments, an outermost perimeter of the lower bumping structure 122 is disposed within the outermost perimeter of the upper conductive pad 114*p*. In other embodiments, the outermost perimeter of the lower bumping structure 122 may be at least partially disposed outside the outermost perimeter of the upper conductive pad 114*p*. In such embodiments, one or more outer sidewalls of the outer sidewalls of the upper conductive pad 114*p* are disposed within the outer sidewalls of the lower bumping structure 122.

In some embodiments, the upper bumping structure 124 contacts both the lower bumping structure 122 and the first sidewall barrier structure 126. The upper bumping structure 124 may completely cover both the lower bumping structure and the first sidewall barrier structure 126. In further embodiments, a lower surface of the upper bumping structure 124 may be substantially planar. In further embodiments, the upper bumping structure 124 may comprise, for example, gold (Au), platinum (Pt), some other suitable metal, or a combination of the foregoing. In yet further embodiments, the lower surface of the upper bumping structure 124 is a lowermost surface of the upper bumping structure 124.

In some embodiments, outer sidewalls of the upper bumping structure 124 engage the first upper portion of the outer sidewalls of the second dielectric structure 118. In further embodiments, outer sidewalls of the upper bumping structure 124 are disposed within the outer sidewalls of the upper conductive pad 114p. The outer sidewalls of the upper bumping structure 124 may be substantially vertical. In yet further embodiments, the outer sidewalls of the upper bumping structure 124 are substantially aligned with the outer sidewalls of the first sidewall barrier structure 126.

In some embodiments, the upper surface of the upper bumping structure 124 is substantially co-planar with the upper surface of the second dielectric structure 118. In further embodiments, the lower surface of the upper bumping structure 124 is substantially planar. In yet further embodiments, a height of the upper bumping structure 124 (e.g., a distance between the upper surface of the upper bumping structure 124 and the lower surface of the upper bumping structure 124) is greater than or equal to the first distance $D_1$.

In some embodiments, an outermost perimeter of the upper bumping structure 124 is disposed within the outermost perimeter of the upper conductive pad 114p. In other embodiments, the outermost perimeter of the upper bumping structure 124 may be at least partially disposed outside the outermost perimeter of the upper conductive pad 114p. In such embodiments, one or more outer sidewalls of the upper conductive pad 114p are disposed within the outer sidewalls of the upper bumping structure 124.

Figure 3:
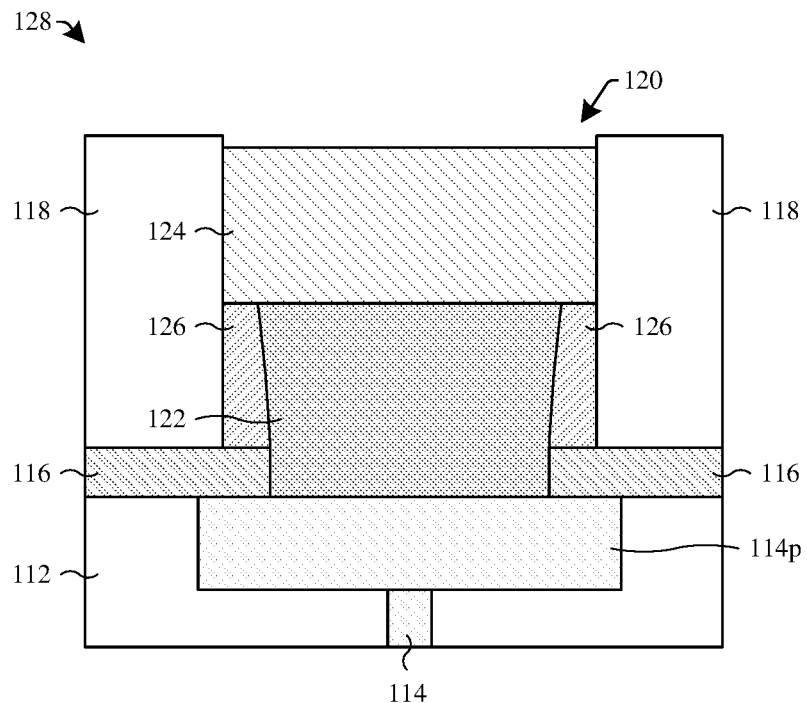
FIG. 3 illustrate an enlarged cross-sectional view of some other embodiments of the area of FIG. 1.

FIG. 3 illustrate an enlarged cross-sectional view of some other embodiments of the area 128 (see, e.g., FIG. 1) of FIG. 1.

As shown in FIG. 3, the upper surface of the upper bumping structure 124 may be disposed below the upper surface of the second dielectric structure 118. In such embodiments, the upper surface of the upper bumping structure 124 may be spaced from the upper surface of the second dielectric structure 118 by less than or equal to 1,000 angstrom (Å). If the upper surface of the upper bumping structure 124 is spaced from the upper surface of the second dielectric structure 118 by greater than 1,000 Å, an electrical connection between an overlying second conductive feature (e.g., conductive wire) and the upper bumping structure 124 may not be satisfactory (e.g., too high of a resistance between the upper bumping structure 124 and the overlying second conductive feature).

Figure 4:
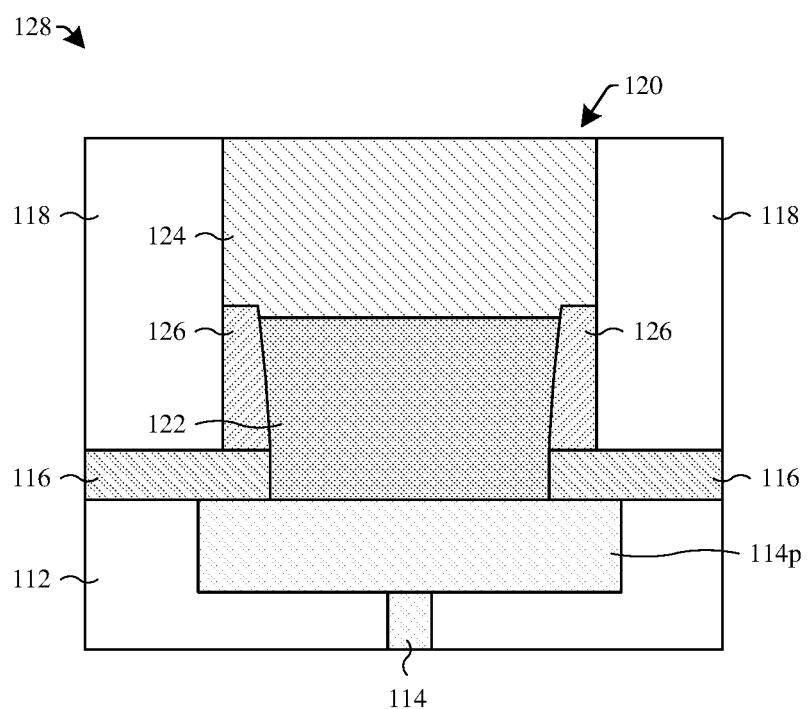
FIG. 4 illustrate an enlarged cross-sectional view of some other embodiments of the area of FIG. 1.

FIG. 4 illustrate an enlarged cross-sectional view of some other embodiments of the area 128 (see, e.g., FIG. 1) of FIG. 1.

As shown in FIG. 4, the upper surface of the lower bumping structure 122 may be disposed below the upper surface of the first sidewall barrier structure 126. In some embodiments, the upper bumping structure 124 has first outer sidewalls that engage the first upper portion of the inner sidewalls of the second dielectric structure 118, and second outer sidewalls that engage the inner sidewalls of the first sidewall barrier structure 126. The second outer sidewalls of the upper bumping structure 124 partially extend vertically along the inner sidewalls of the first sidewall barrier structure 126. The second outer sidewalls of the upper bumping structure 124 are disposed between the first outer sidewalls of the upper bumping structure 124. In further embodiments, the upper bumping structure 124 has a first lower surface that engages the upper surface of the lower bumping structure 122 and a second lower surface that engages the upper surface of the first sidewall barrier structure 126. The second lower surface of the upper bumping structure 124 is disposed above the first lower surface of the upper bumping structure 124. In yet further embodiments, the second lower surface of the upper bumping structure 124 laterally extends around the first lower surface of the upper bumping structure 124 in a continuous closed path.

Figure 5:
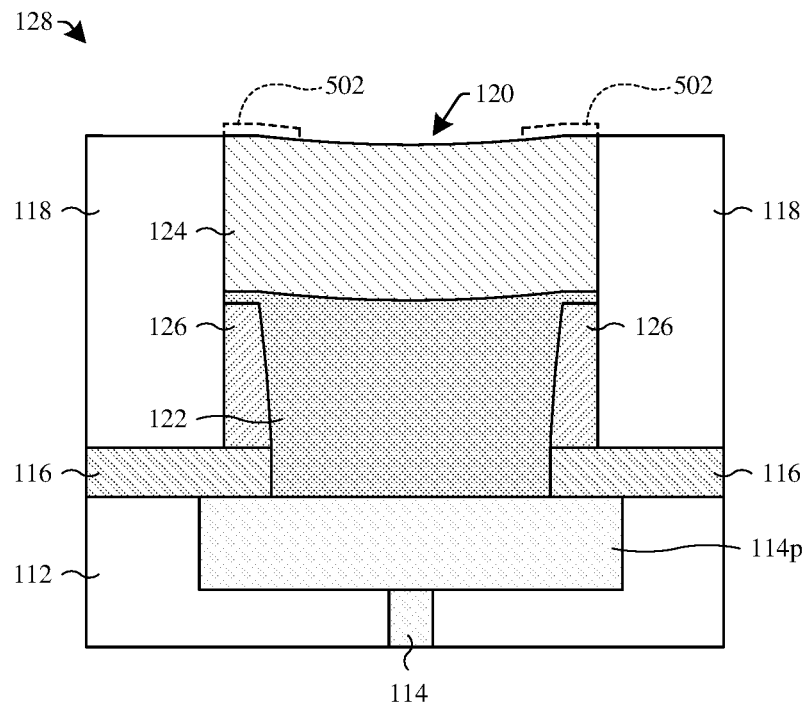
FIG. 5 illustrate an enlarged cross-sectional view of some other embodiments of the area of FIG. 1.

FIG. 5 illustrate an enlarged cross-sectional view of some other embodiments of the area 128 (see, e.g., FIG. 1) of FIG. 1.

As shown in FIG. 5, the lower bumping structure 122 may be partially disposed over the first sidewall barrier structure 126. In some embodiments, the upper surface of the lower bumping structure 122 has a first concave portion and a first ring-shaped portion. The first ring-shaped portion extends laterally around the first concave portion in a continuous closed path. In some embodiments, the first ring-shaped portion is disposed directly over the first sidewall barrier structure 126. In further embodiments, a lowermost point of the first concave portion is disposed over the upper surface of the first sidewall barrier structure 126. In other embodiments, the lowermost point of the first concave portion is disposed below the upper surface of the first sidewall barrier structure 126.

In some embodiments, the lower surface of the upper bumping structure 124 has a second concave portion and a second ring-shaped portion. The second concave portion engages the first concave portion, and the second ring-shaped portion engages the first ring-shaped portion. The second ring-shaped portion extends laterally around the second concave portion in a continuous closed path. In some embodiments, the second ring-shaped portion is disposed directly over the first ring-shaped portion. In further embodiments, a lowermost point of the second concave portion is disposed over the upper surface of the first sidewall barrier structure 126. In other embodiments, the lowermost point of the second concave portion is disposed below the upper surface of the first sidewall barrier structure 126.

In some embodiments, the upper surface of the upper bumping structure 124 has a third concave portion and a third ring-shaped portion. The third ring-shaped portion extends laterally around the third concave portion in a continuous closed path. In some embodiments, the third ring-shaped portion is disposed directly over the first ring-shaped portion and/or the second ring-shaped portion. A lowermost point of the third concave portion is disposed below the upper surface of the second dielectric structure 118.

An uppermost point of the third ring-shaped portion is disposed at or below the uppermost point of the second dielectric structure 118. Because the uppermost point of the third ring-shaped portion is disposed at or below the uppermost point of the second dielectric structure 118, the upper bumping structure 124 does not have a "fence" structure 502 (illustrated as a dotted line to provide additional context) that extends over the upper surface of the second dielectric structure 118. Accordingly, the bumping structure 120 may improve the bondability of the IC 100 to a transparent screen panel (e.g., a glass screen panel) and/or a carrier substrate (e.g., carrier wafer). In other words, if the bumping structure 120 had the "fence" structure 502, the "fence" structure 502 would be a high stress point that would negatively impact the bondability of the IC 100 to a transparent screen panel and/or a carrier substrate (e.g., due to the high stress point causing cracking/shattering/delamination of the transparent screen panel). In some embodiments, the uppermost point of the third ring-shaped portion is not disposed over the uppermost point of the second dielectric structure 118. Because the uppermost point of the third ring-shaped portion is not disposed over the uppermost point of the second dielectric structure 118, the upper bumping structure 124 does not have the "fence" structure 502 that extends over the upper surface of the second dielectric structure 118. Accordingly, the bumping structure 120 may improve the bondability of the IC 100 to a transparent screen panel (e.g., a glass screen panel) and/or a carrier substrate (e.g., carrier wafer).

Figure 6:
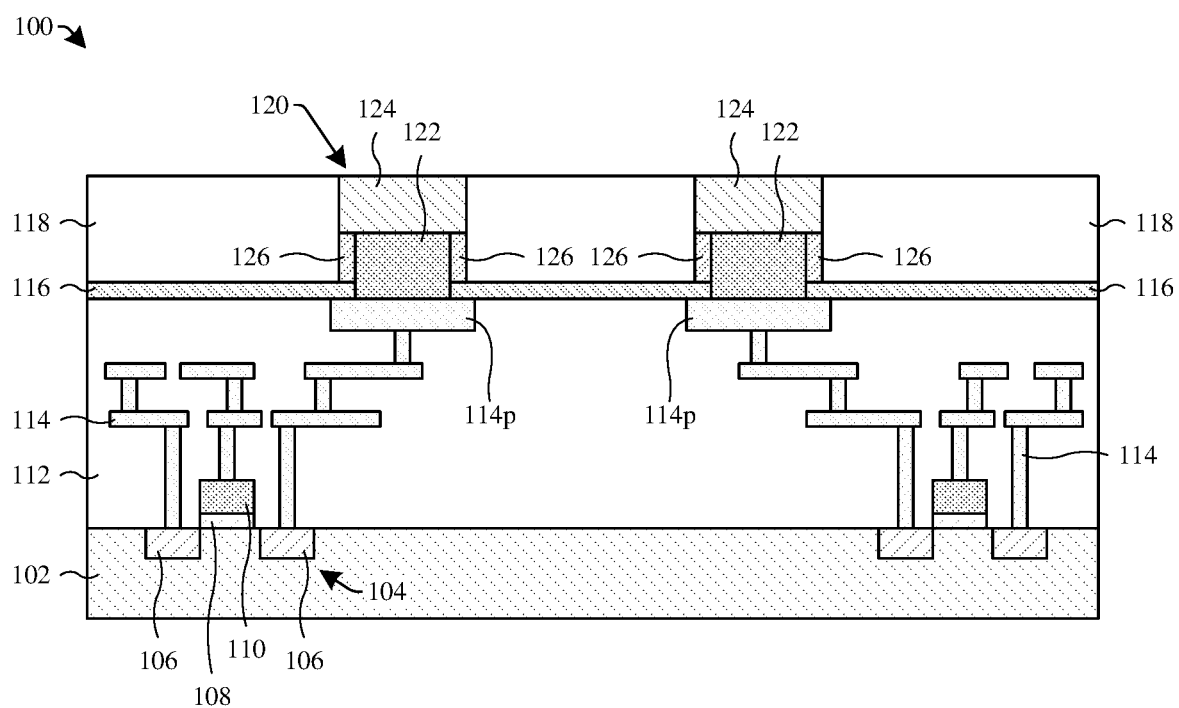
FIG. 6 illustrates a cross-sectional view of some other embodiments of the IC of FIG. 1.

FIG. 6 illustrates a cross-sectional view of some other embodiments of the IC 100 of FIG. 1.

As shown in FIG. 6, the IC 100 may comprise a plurality of bumping structures disposed over the interconnect structure 114 and the ILD structure 112. The bumping structures of the plurality of bumping structures are electrically coupled to the interconnect structure 114. In some embodiments, bumping structures of the plurality of bumping structures are electrically coupled to the interconnect structure 114 via a plurality of upper conductive pads, respectively. Each of the bumping structures of the plurality of bumping structures comprises a lower bumping structure 122, an upper bumping structure 124, and a first sidewall barrier structure 126. It will be appreciated that, in some embodiments, the bumping structure 120 is the only bumping structure disposed on the IC 100 (e.g., the IC 100 only comprises one bumping structure).

Figure 7:
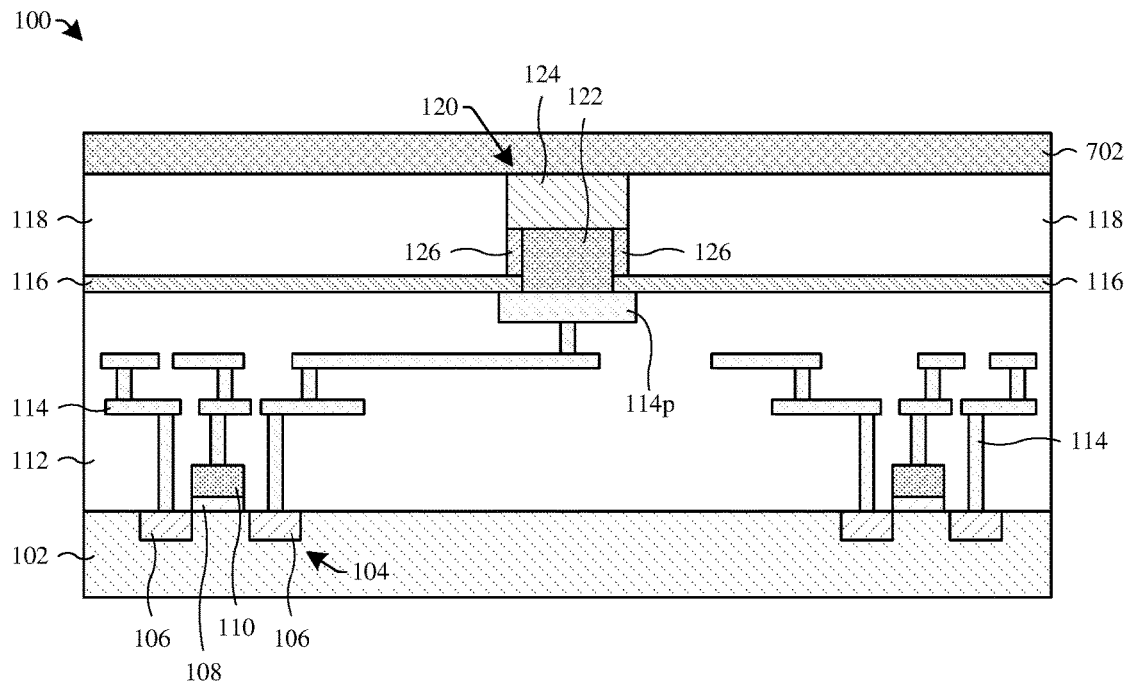
FIG. 7 illustrates a cross-sectional view of some other embodiments of the IC of FIG. 1.

FIG. 7 illustrates a cross-sectional view of some other embodiments of the IC 100 of FIG. 1.

As shown in FIG. 7, the IC 100 comprises a carrier substrate 702 disposed over the bumping structure 120, the ILD structure 112, and the semiconductor substrate 102. The carrier substrate 702 may be bonded to the second dielectric structure 118 and/or the upper bumping structure 124. In some embodiments, the carrier substrate 702 may be, for example, a polyimide substrate, semiconductor substrate, or the like. Because the IC 100 comprises the bumping structure 120, an improved bond interface between the carrier substrate 702 and the IC 100 exists, thereby improving yield (e.g., by preventing damage to the IC 100 during bonding of the IC 100 to the carrier substrate 702).

Figure 8:
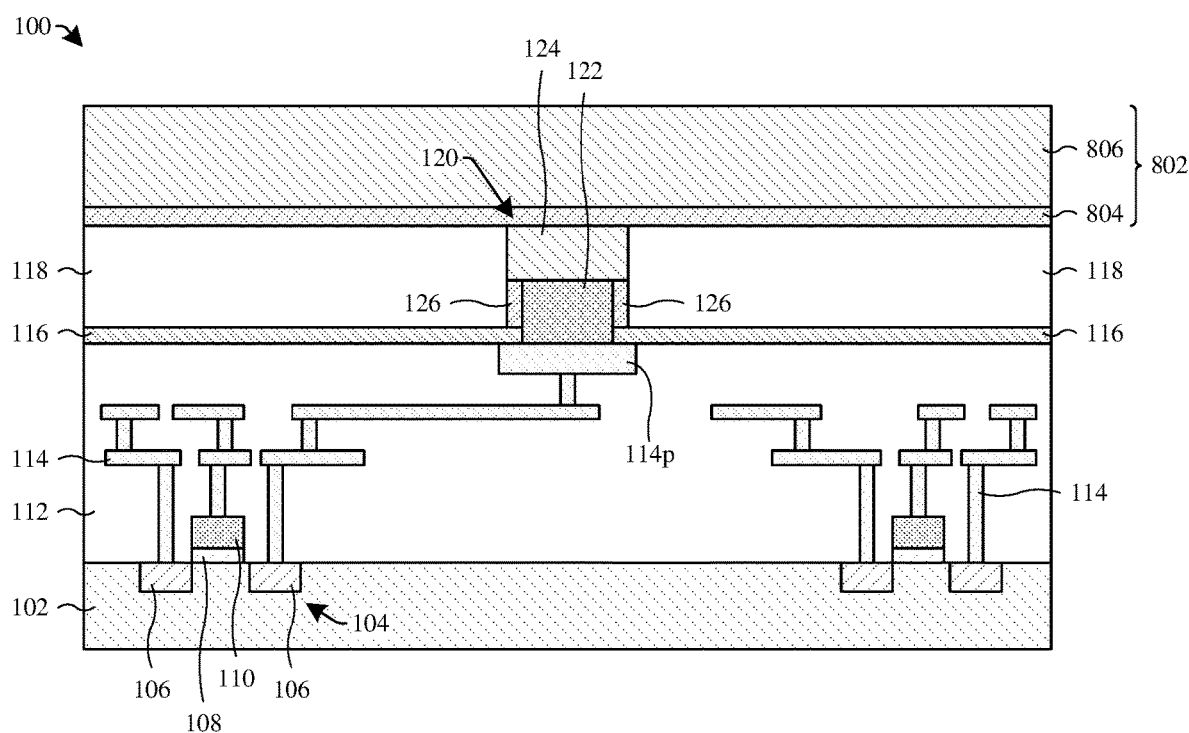
FIG. 8 illustrates a cross-sectional view of some other embodiments of the IC of FIG. 1.

FIG. 8 illustrates a cross-sectional view of some other embodiments of the IC 100 of FIG. 1.

As shown in FIG. 8, the IC 100 comprises a screen panel 802 disposed over the bumping structure 120, the ILD structure 112, and the semiconductor substrate 102. The screen panel 802 is bonded to the IC 100. The screen panel comprises a transparent bonding layer 804 (e.g., silicone gel, urethane, or some other suitable adhesive) and a transparent cover structure 806 (e.g., a cover glass, touchscreen, or the like). The transparent bonding layer 804 is disposed between the transparent cover structure 806 and both the bumping structure 120 and the second dielectric structure 118. Because the IC 100 comprises the bumping structure 120, an improved bond interface between the screen panel 802 and the IC 100 exists, thereby improving yield (e.g., by preventing damage to the IC 100 and/or screen panel 802 during bonding of the IC 100 to the screen panel 802).

Figure 9:
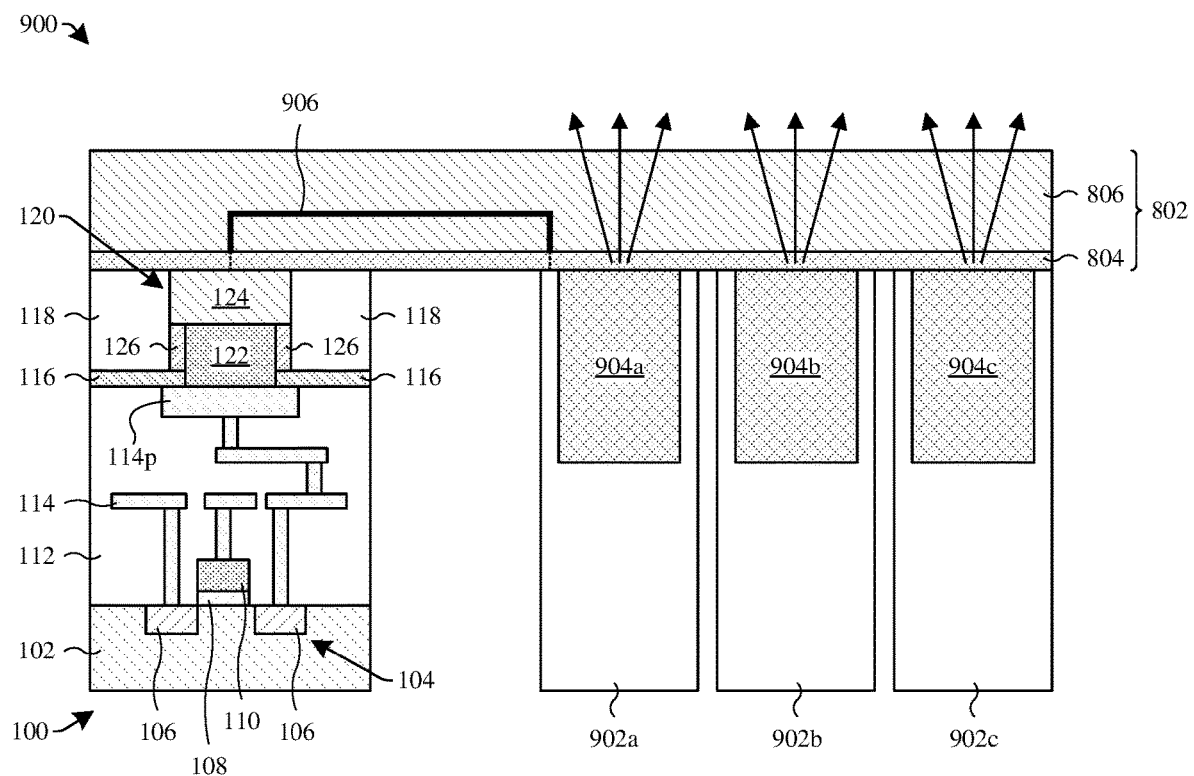
FIG. 9 illustrates a cross-sectional view of some embodiments of a display device comprising some embodiments of the IC of FIG. 1.

FIG. 9 illustrates a cross-sectional view of some embodiments of a display device 900 comprising some embodiments of the IC 100 of FIG. 1.

As shown in FIG. 9, the display device 900 comprises the IC 100 and a plurality of light-emitting ICs 902a-c. For example, the display device comprises a first light-emitting IC 902a, a second light-emitting IC 902b, and a third light-emitting IC 902c. The light-emitting ICs 902a-c comprise one or more light-emitting structures 904a-c (e.g., light-emitting diode (LED), microLED, etc.). For example, the first light-emitting IC 902a comprises a first light-emitting structure 904a, the second light-emitting IC 902b comprises a second light-emitting structure 904b, and the third light-emitting IC 902c comprises a third light-emitting structure 904c. The light-emitting ICs 902a-c may comprise one or more semiconductor devices (not illustrated in FIG. 9 for ease of illustration) disposed on a semiconductor substrate (not illustrated in FIG. 9 for ease of illustration) and electrically coupled to the one or more light-emitting structures 904a-c.

The one or more light-emitting structures 904a-c are configured to emit light having a specific wavelength through the screen panel 802 (e.g., illustrated by arrows in FIG. 9). In some embodiments, the light emitted by the one or more light-emitting structures 904a-c is colored light. For example, the first light-emitting structure 904a is configured to emit red light, the second light-emitting structure 904b is configured to emit green light, and the third light-emitting structure 904c is configured to emit blue light.

The IC 100 and the plurality of light-emitting ICs 902a-c are bonded to the screen panel 802. Because the IC 100 comprises the bumping structure 120, an improved bond interface between the screen panel 802 and the IC 100 exists. For example, because the upper bumping structure 124 does not have the "fence" structure 502 (see, e.g., FIG. 5) that extends over the upper surface of the second dielectric structure 118, the bond interface between the IC 100 and the screen panel 802 is improved. The improved bond interface may improve robustness of the display device 900 (e.g., resistance of the screen panel 802 to crack/shatter/delaminate in response to a given mechanical force being applied on the transparent cover structure 806) and/or yield of the display device 900. For example, the improved bond interface may improve the robustness of the display device 900 and/or yield of the display device 900 due to the bumping structure 120 reducing high-stress points that may cause cracking/shattering/delamination of the screen panel 802 during fabrication (or during consumer use) of the display device 900 (e.g., due to the reduction in high-stress points increasing an amount of mechanical force that can be applied on the transparent cover structure 806 before cracking/shattering/delamination of the screen panel 802).

In some embodiments, one or more second conductive features 906 (e.g., conductive lines) are disposed in the transparent cover structure 806. The one or more second conductive features 906 are configured to electrically couple the light-emitting ICs 902a-c to the IC 100. In some embodiments, the transparent bonding layer 804 is configured to provide electrical connections (illustrated by a dotted line in FIG. 9) between the one or more second conductive features 906, the IC 100, and the light-emitting ICs 902a-c. In further embodiments, the bumping structure 120 is electrically coupled to the one or more second conductive features 906. In yet further embodiments, input/output (110) structures (not illustrated in FIG. 9 for ease of illustration) of the light-emitting ICs 902a-c are electrically coupled to the one or more second conductive features 906. It will be appreciated that, in some embodiments, a filler material is disposed between the IC 100 and the light-emitting ICs 902a-c to provide structural support between the IC 100 and the light-emitting ICs 902a-c.

In some embodiments, the IC 100 comprises control circuitry for the display device 900. For example, the control circuitry is configured to provide electrical signals (e.g., voltages) to the light-emitting ICs 902a-c so that the display device 900 displays a desired image. In further embodiments, the IC 100 does not comprise any light-emitting structures. In such embodiments, the IC 100 may only comprise circuitry for controlling the light-emitting ICs 902a-c.

Figure 10A:
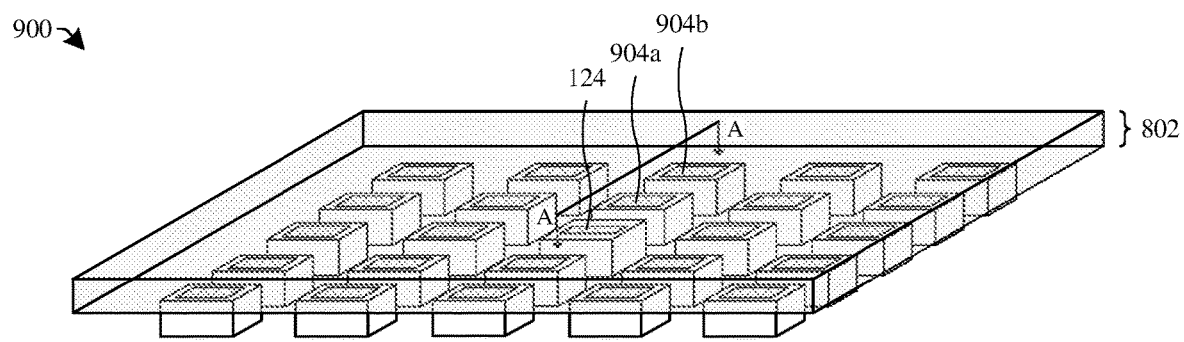
FIGS. 10A-10B illustrate various views of some other embodiments of the display device of FIG. 9.
Figure 10B:
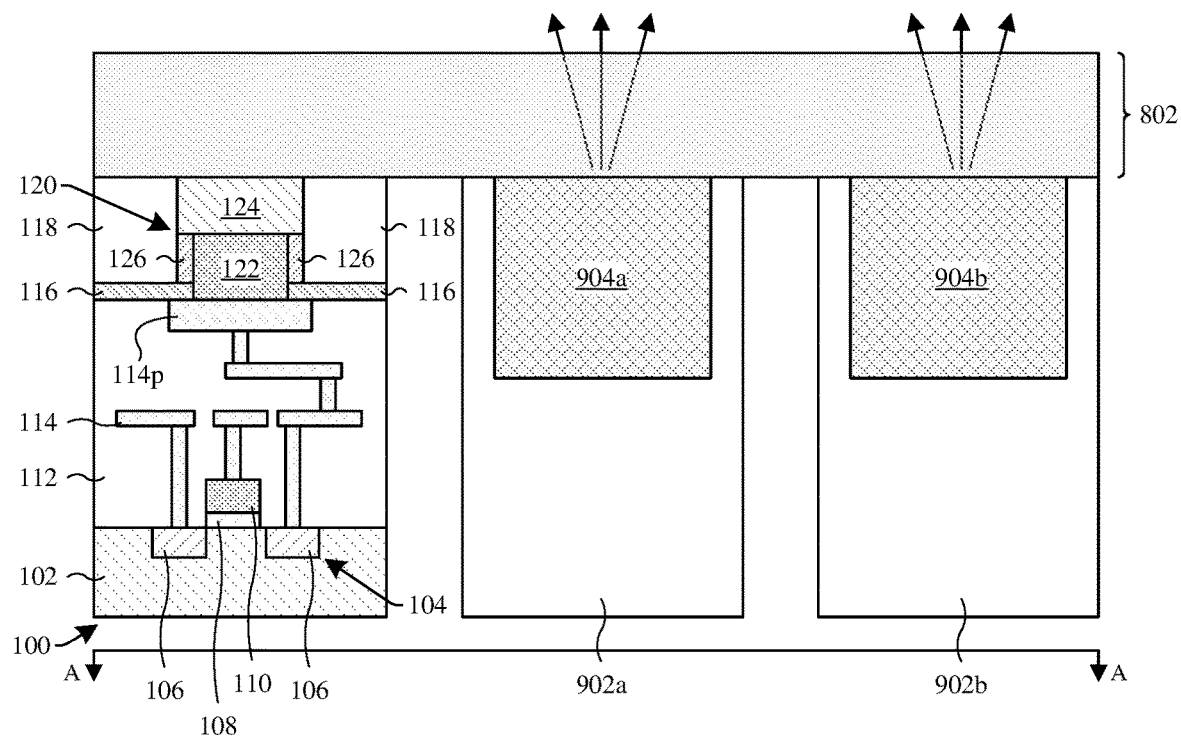

FIGS. 10A-10B illustrate various views of some other embodiments of the display device 900 of FIG. 9. FIG. 10A illustrates an isometric view of some other embodiments of the display device of FIG. 9. FIG. 10B illustrates a cross-sectional view of some embodiments of the display device of FIG. 10A taken along line A-A of FIG. 10A.

As shown in FIGS. 10A-10B, the IC 100 and the light-emitting ICs 902a-c may be disposed in an array (e.g., 5×5 array). In some embodiments, the IC 100 may be disposed at a center of the array. It will be appreciated that, in other embodiments, the IC 100 may be disposed anywhere in the array (or outside of the array). It will further be appreciated that the display device 900 may comprise other sized arrays (e.g., a 4×4 array, 7×7 array, etc.). The IC 100 is electrically coupled to the light-emitting ICs 902a-c of the array (e.g., via one or more second conductive features 906 (not illustrated in FIGS. 10A-10B for clarity). The IC 100 is configured to provide electrical signals (e.g., voltages) to each of the light-emitting ICs 902a-c so that the display device 900 displays a desired image.

The screen panel 802 extends continuously over the IC 100 and the light-emitting ICs 902a-c. Each of the light-emitting ICs 902a-c and the IC 100 is bonded to the screen panel 802. It will be appreciated that the display device 900 may comprise any number of arrays, each of which comprise the IC 100 and the light-emitting ICs 902a-c, bonded to the screen panel 802. For example, the display device may comprise a first array comprising a first IC (e.g., IC 100) and a first plurality of light-emitting ICs (e.g., light-emitting ICs 902a-c) and a second array disposed on a side of the first array and comprising a second IC (e.g., IC 100) and a second plurality of light-emitting ICs (e.g., light-emitting ICs 902a-c). The first IC is configured to control the first plurality of light-emitting ICs, and the second IC is configured to control the second plurality of light-emitting ICs. Depending on a desired display size of the display device 900, the display device 900 comprises a predefined number of arrays arranged in a larger array so that the display device 900 has the desired display size (e.g., 1.5", 1.7", 5.8", 6.1", 6.5" 10.2", 10.5", 12.9", 15.4", 17", 35", 42", 48" 55", 65", 75", etc.).

Figure 11A:
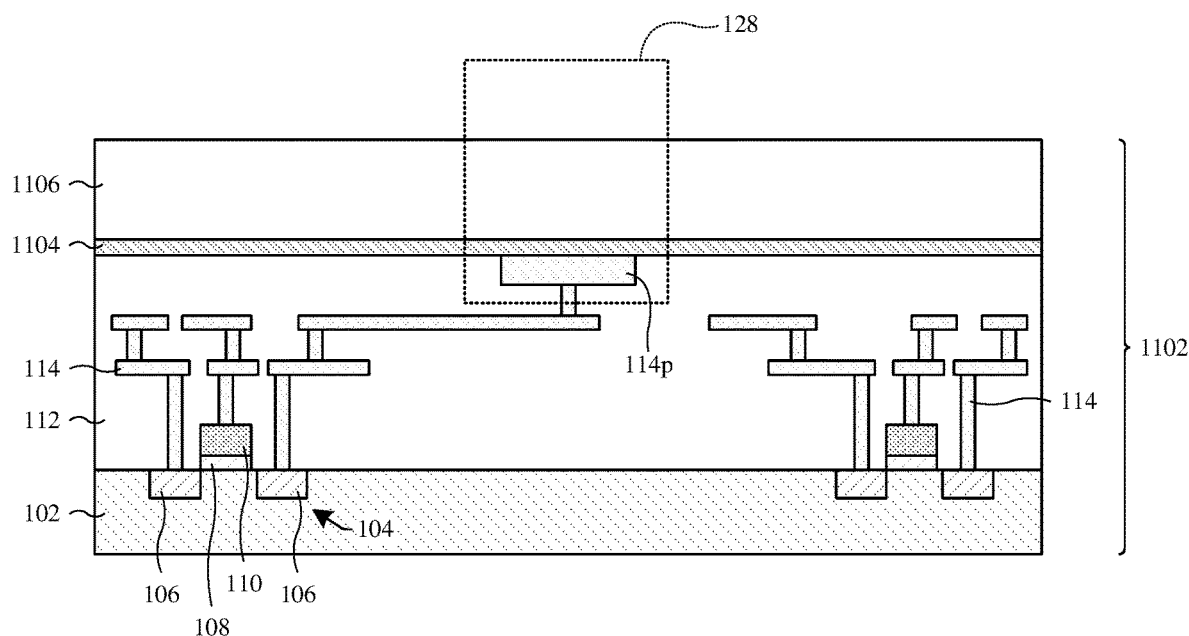
FIGS. 11A-11B through 24A-24B illustrate a series of cross-sectional views of some embodiments of a method for forming some embodiments of the IC of FIG. 1.
Figure 11B:
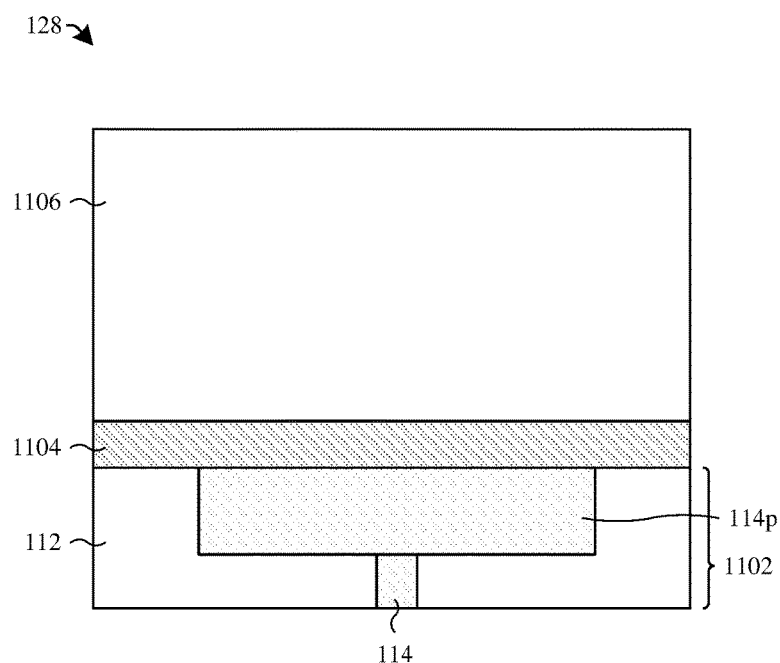

FIGS. 11A-11B through 24A-24B illustrate a series of cross-sectional views of some embodiments of a method for forming some embodiments of the IC 100 of FIG. 1. Figures with a suffix of "A" (e.g., FIG. 11A) illustrate a series of cross-sectional views of some embodiments of the method for forming some embodiments of the IC 100 of FIG. 1. Figures with a suffix of "B" (e.g., FIG. 11B) illustrate a series of enlarged cross-sectional views of an area of a corresponding figure having a suffix of "A." For example, FIG. 11B illustrates an enlarged cross-sectional view of the area 128 of FIG. 11A, FIG. 12B illustrates an enlarged cross-sectional view of the area 128 of FIG. 12A, and so forth.

As shown in FIGS. 11A-11B, a workpiece 1102 is received. The workpiece 1102 comprises a semiconductor substrate 102. One or more semiconductor devices 104 are disposed on/in the semiconductor substrate 102. An ILD structure 112 is disposed over the semiconductor substrate and the one or more semiconductor devices 104. An interconnect structure 114 is embedded in the ILD structure 112 and disposed over the semiconductor substrate 102. The interconnect structure 114 comprises an upper conductive pad 114p.

In some embodiments, a method for forming the workpiece 1102 comprises forming the one or more semiconductor devices 104 by forming pairs of source/drain regions in the semiconductor substrate 102 (e.g., via ion implantation). Thereafter, gate dielectrics and gate electrodes are formed over the semiconductor substrate 102 and between the pairs of source/drain regions (e.g., via deposition/growth processes and etching processes). A first ILD layer is then formed over the one or more semiconductor devices 104, and contact openings are formed in the first ILD layer. A conductive material (e.g., W) is formed on the first ILD layer and in the contact openings. Thereafter, a planarization process (e.g., chemical-mechanical polishing (CMP)) is performed into the conductive material to form conductive contacts (e.g., metal contacts) in the first ILD layer.

A second ILD layer is then formed over the first ILD layer and the conductive contacts, and first conductive line trenches are formed in the second ILD layer. A conductive material (e.g., Cu) is formed on the second ILD layer and in the first conductive line trenches. Thereafter, a planarization process (e.g., CMP) is performed into the conductive material to form conductive lines (e.g., metal 1) in the second ILD. A third ILD layer is then formed over the second ILD layer and the conductive line, and conductive via openings are formed in the third ILD layer. A conductive material (e.g., Cu) is formed on the third ILD layer and in the conductive via openings. Thereafter, a planarization process (e.g., CMP) is performed into the conductive material to form conductive vias (e.g., metal vias) in the third ILD layer. The above processes for forming the conductive line and the conductive vias may be repeated any number of times to form the ILD structure 112 and the interconnect structure 114 embedded in the ILD structure 112.

Also shown in FIGS. 11A-11B, a first dielectric layer 1104 is formed over the semiconductor substrate 102, the ILD structure 112, and the interconnect structure 114. The first dielectric layer 1104 covers the upper conductive pad 114p. In some embodiments, the first dielectric layer 1104 comprises a nitride (e.g., SiN), an oxide (e.g., $SiO_2$), an oxy-nitride (e.g., $SiO_xN_y$), some other dielectric material, or a combination of the foregoing. In further embodiments, the first dielectric layer 1104 is SiN. The first dielectric layer 1104 may be formed by depositing the first dielectric layer 1104 on the ILD structure 112 and the upper conductive pad 114p. In some embodiments, the first dielectric layer 1104 may be deposited by, for example, chemical vapor deposition (CVD), physical vapor deposition (PVD), atomic layer deposition (ALD), some other deposition process, or a combination of the foregoing.

Also shown in FIGS. 11A-11B, a second dielectric layer 1106 is formed over the first dielectric layer 1104. In some embodiments, the second dielectric layer 1106 comprises an oxide (e.g., $SiO_2$), a nitride (e.g., SiN), an oxy-nitride (e.g., $SiO_xN_y$), some other dielectric material, or a combination of the foregoing. In further embodiments, the second dielectric layer 1106 is $SiO_2$. The second dielectric layer 1106 may be formed by depositing the second dielectric layer 1106 on the first dielectric layer 1104. In some embodiments, the second dielectric layer 1106 may be deposited by, for example, CVD, PVD, ALD, some other deposition process, or a combination of the foregoing.

Figure 12A:
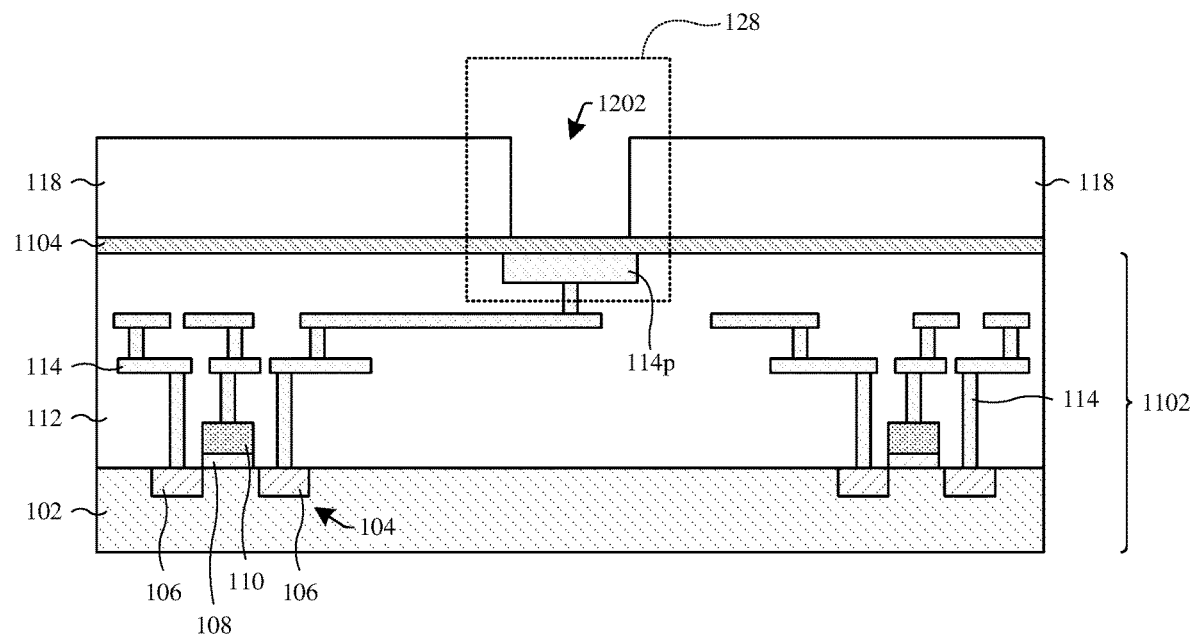
Figure 12B:
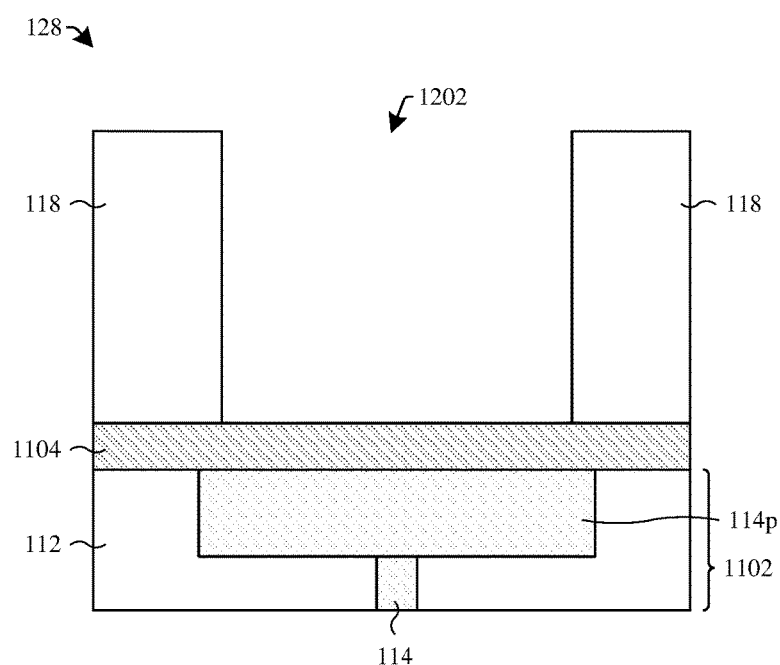

As shown in FIGS. 12A-12B, a second dielectric structure 118 is formed over the first dielectric layer 1104. The second dielectric structure 118 is formed with inner sidewalls that are laterally spaced apart. In some embodiments, the inner sidewalls of the second dielectric structure 118 are disposed within an outermost perimeter of the upper conductive pad 114*p*. In other embodiments, one or more of the inner sidewalls of the second dielectric structure 118 are disposed outside the outermost perimeter of the upper conductive pad 114*p*. In further embodiments, the inner sidewalls of the second dielectric structure are substantially vertical.

In some embodiments, a process for forming the second dielectric structure 118 comprises forming a patterned masking layer (not shown) on the second dielectric layer 1106 (see, e.g., FIGS. 11A-11B). In further embodiments, the patterned masking layer may be formed by forming a masking layer (not shown) over the second dielectric layer 1106, exposing the masking layer to a pattern (e.g., via photolithography), and developing the masking layer to form the patterned masking layer. Thereafter, with the patterned masking layer in place, an etching process (e.g., wet/dry etch) is performed on the second dielectric layer 1106 to remove unmasked portions of the second dielectric layer 1106, thereby forming the second dielectric structure 118. The second dielectric structure 118 corresponds to the portion of the second dielectric layer 1106 remaining over the first dielectric layer 1104 after the etching process is performed on the second dielectric layer 1106. Subsequently, the patterned masking layer may be stripped away.

After the second dielectric structure 118 is formed, a third opening 1202 is disposed in the second dielectric structure 118 and over the upper conductive pad 114*p*. The third opening 1202 is defined by a first central portion of an upper surface of the first dielectric layer 1104 and the inner sidewalls of the second dielectric structure 118. The first central portion of the upper surface of the first dielectric layer 1104 is disposed directly between the inner sidewalls of the second dielectric structure 118. In some embodiments, an uppermost boundary of the third opening 1202 is disposed at (or below) an upper surface of the second dielectric structure 118. In further embodiments, the third opening 1202 is formed with an outermost perimeter disposed within the outermost perimeter of the upper conductive pad 114*p*. In other embodiments, the third opening 1202 is formed so that the outermost perimeter of the third opening 1202 is formed at least partially outside the outermost perimeter of the upper conductive pad 114*p*.

Figure 13A:
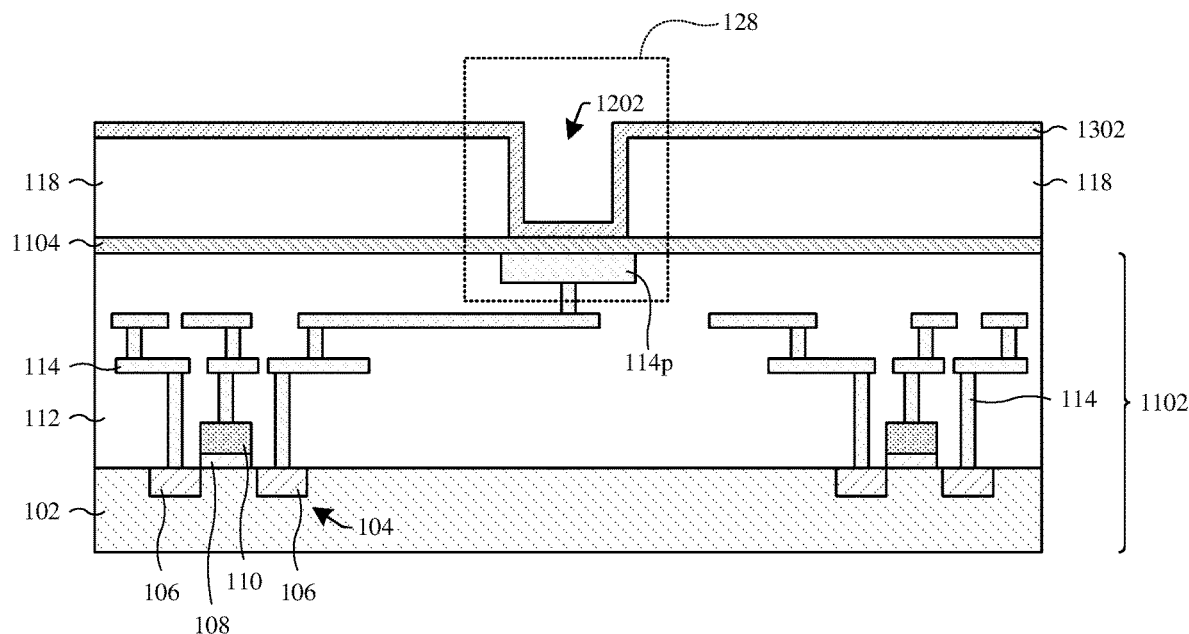
Figure 13B:
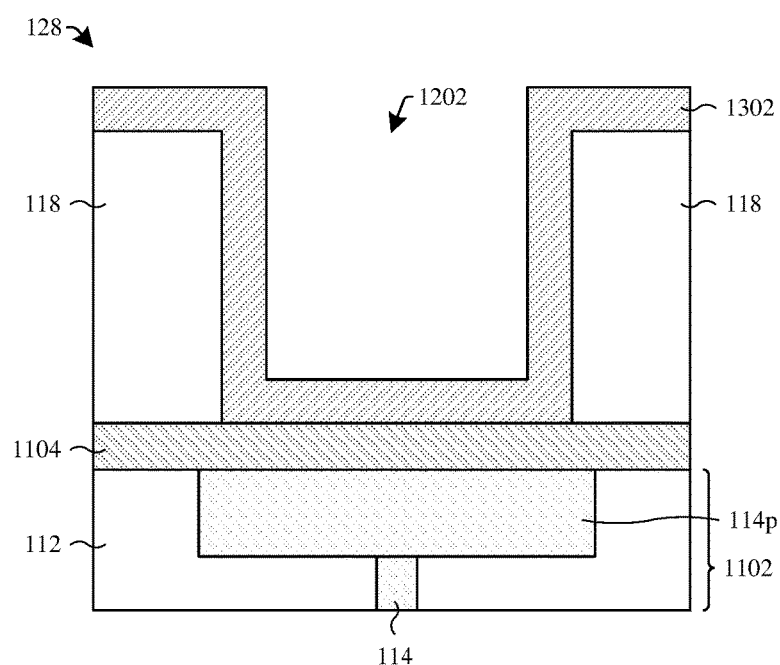

As shown in FIGS. 13A-13B, a barrier layer 1302 is formed over the second dielectric structure 118 and the first dielectric layer 1104. The barrier layer 1302 is formed lining the sidewalls of the third opening 1202, the first central portion of the upper surface of the first dielectric layer 1104, and the upper surface of the second dielectric structure 118. In some embodiments, the barrier layer 1302 may comprise, for example, Ti, TiN, some other material that sufficiently blocks diffusion of atoms from the upper conductive pad 114*p* to the upper bumping structure 124, or a combination of the foregoing. The barrier layer 1302 may be formed as a conformal layer. In further embodiments, a process for forming the barrier layer 1302 comprises depositing the barrier layer 1302 on the second dielectric structure 118, on the first dielectric layer 1104, and lining the sidewalls of the third opening 1202. The barrier layer 1302 may be deposited by, for example, CVD, PVD, ALD, sputtering, some other deposition process, or a combination of the foregoing.

Figure 14A:
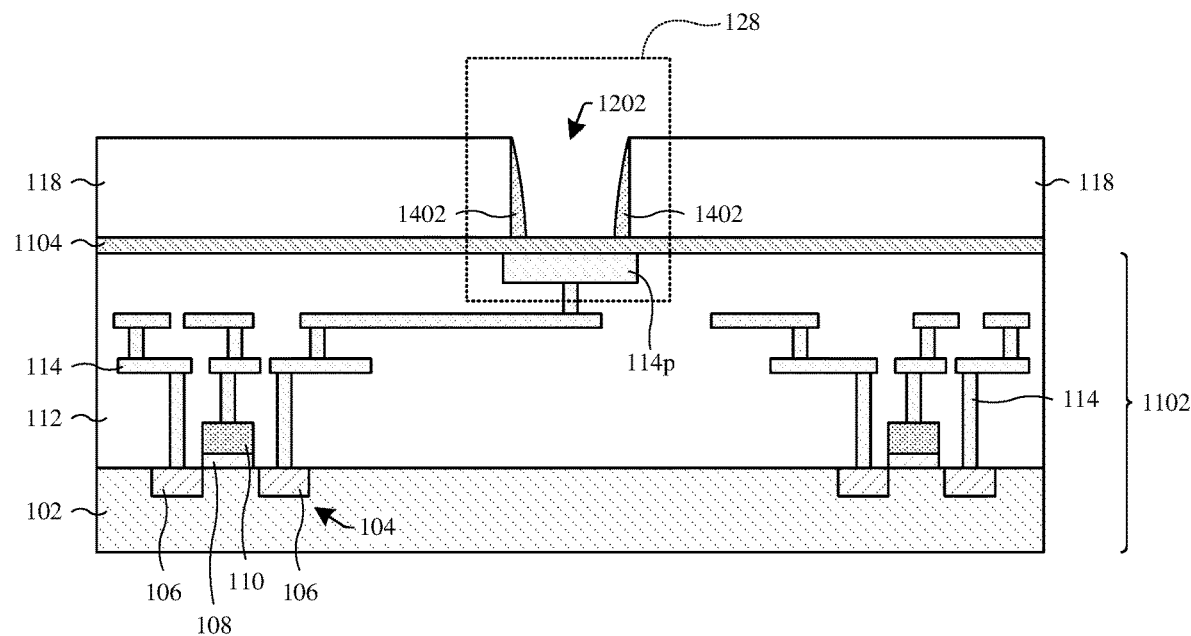
Figure 14B:
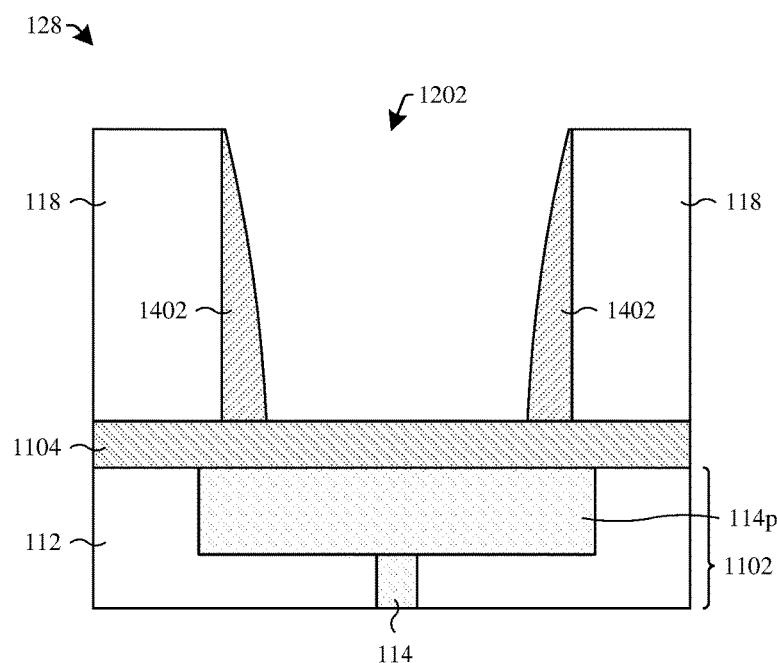

As shown in FIGS. 14A-14B, a second sidewall barrier structure 1402 is formed along the sidewalls of the third opening 1202. In some embodiments, the second sidewall barrier structure 1402 is formed with a height that is substantially the same as a height of the third opening 1202. In further embodiments, a process for forming the second sidewall barrier structure 1402 comprises performing an etching process on the barrier layer 1302 (see, e.g., FIGS. 13A-13B) to remove the barrier layer 1302 from horizontal surfaces, leaving the barrier layer 1302 along the sidewalls of the third opening 1202 as the second sidewall barrier structure 1402.

Figure 15A:
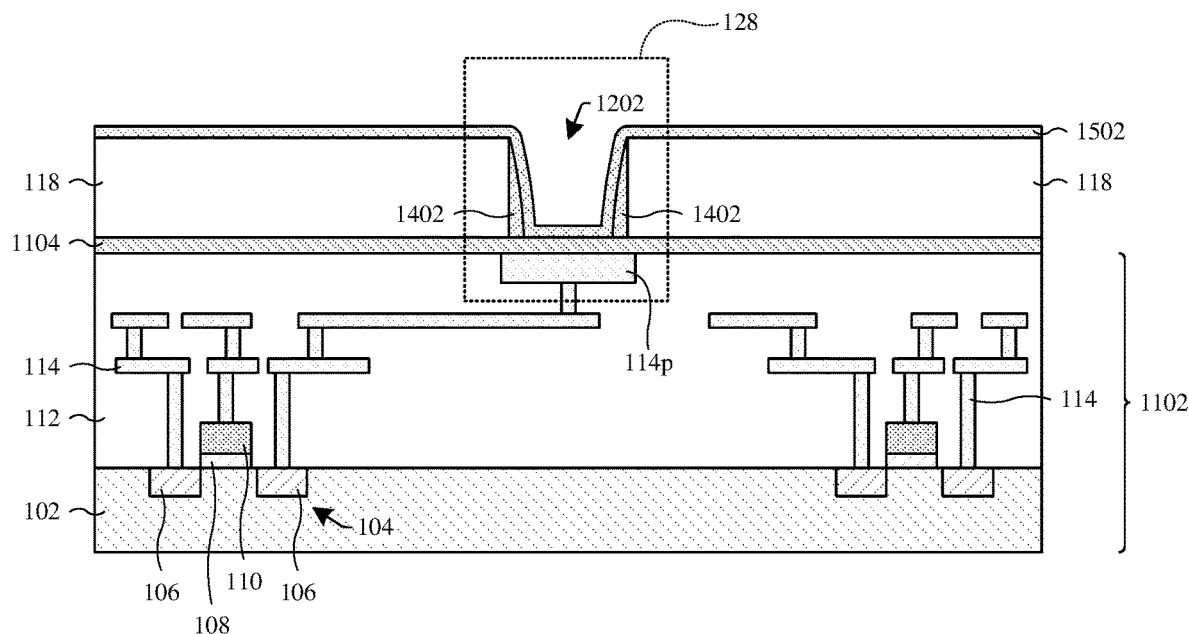
Figure 15B:
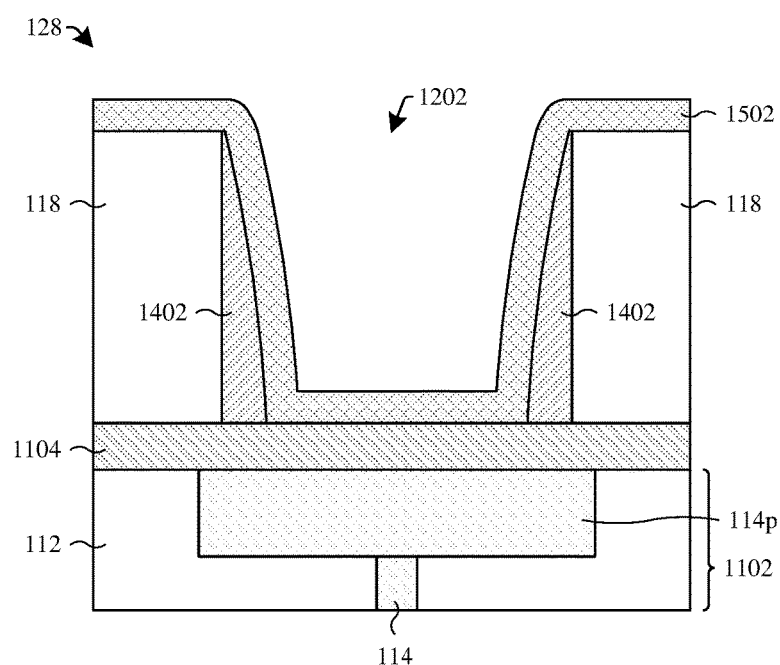

As shown in FIGS. 15A-15B, a hardmask layer 1502 is formed over the second dielectric structure 118, the first dielectric layer 1104, and the second sidewall barrier structure 1402. The hardmask layer 1502 is formed at least partially in the third opening 1202 and lining inner sidewalls of the second sidewall barrier structure 1402. The hardmask layer 1502 has a first density and the second dielectric structure 118 has a second density that is less than the first density. In some embodiments, the hardmask layer 1502 is a conformal layer. The hardmask layer 1502 may be or comprise, for example, an oxide (e.g., $SiO_2$), a nitride (e.g., SiN), an oxy-nitride (e.g., $SiO_xN_y$), or the like. In further embodiments, the hardmask layer is $SiO_2$. In yet further embodiments, the hardmask layer 1502 is a high-temperature oxide (HTO) (e.g., $SiO_2$ formed by a high-temperature deposition/growth process). The hardmask layer 1502 may be formed with a thickness less than or equal to 100 angstroms (Å).

In some embodiments, a process for forming the hardmask layer 1502 comprises depositing the hardmask layer 1502 on the second dielectric structure 118, on the first dielectric layer 1104, and on the inner sidewalls of the second sidewall barrier structure 1402. The hardmask layer 1502 may be deposited by, for example, CVD, PVD, ALD, sputtering, some other deposition process, or a combination of the foregoing. In further embodiments, the hardmask layer is formed in a processing chamber at a temperature greater than 400° C.

Figure 16A:
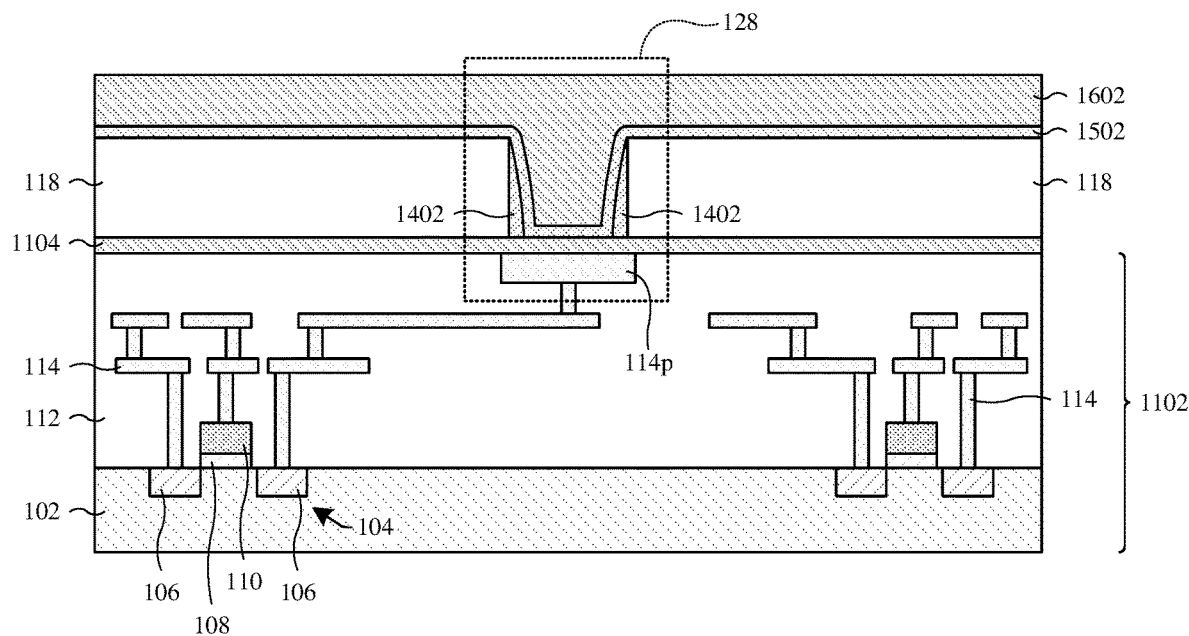
Figure 16B:
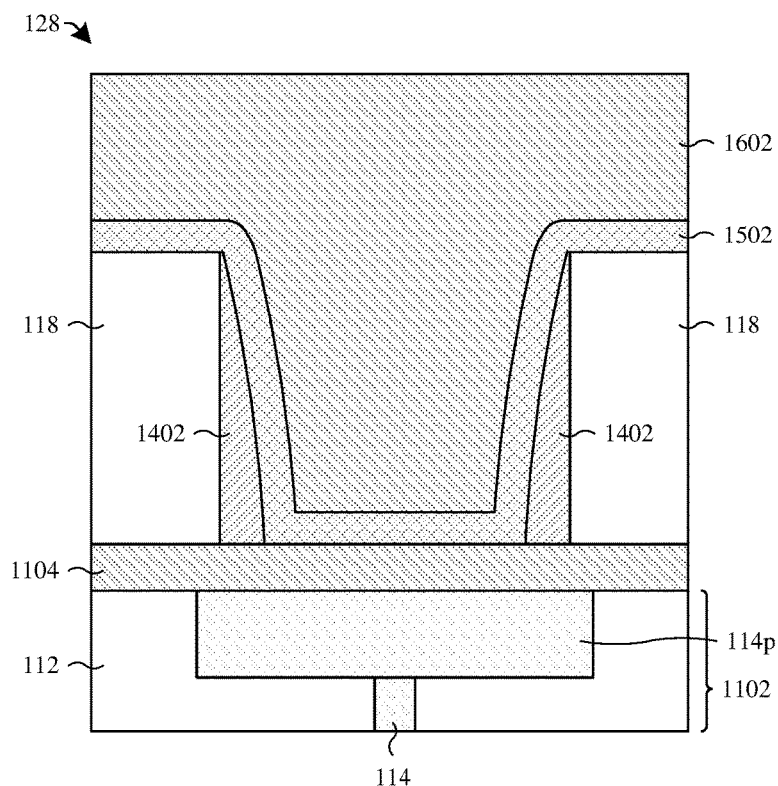

As shown in FIGS. 16A-16B, a first masking structure 1602 is formed over the hardmask layer 1502 and the second dielectric structure 118. The first masking structure 1602 is formed in the third opening 1202 (see, e.g., FIGS. 15A-15B). In some embodiments, the first masking structure 1602 completely fills the third opening 1202. The first masking structure 1602 may be formed with a substantially planar upper surface that is disposed over an upper surface of the hardmask layer 1502. In some embodiments, the first masking structure 1602 may comprise, for example, a positive photoresist, a negative photoresist, or the like. In further embodiments, the upper surface of the first masking structure 1602 is an uppermost surface of the first masking structure 1602. In yet further embodiments, the upper surface of the hardmask layer 1502 is an uppermost surface of the hardmask layer 1502.

In some embodiments, a process for forming the first masking structure 1602 comprises depositing a masking layer (not shown) (e.g., positive photoresist, negative photoresist, or the like) on the hardmask layer 1502 and filling the third opening 1202. The masking layer may be deposited by CVD, PVD, ALD, a spin coating process, a spray coating process, a roller coating process, a dip coating process, some other deposition process, or a combination of the foregoing. The masking layer is then exposed to electromagnetic radiation (e.g., ultraviolet (UV) light), thereby forming the first masking structure 1602. In some embodiments, the masking layer may be exposed to a pattern of electromagnetic radiation (e.g., via photolithography) and then developed, thereby forming the first masking structure 1602 with the pattern.

Figure 17A:
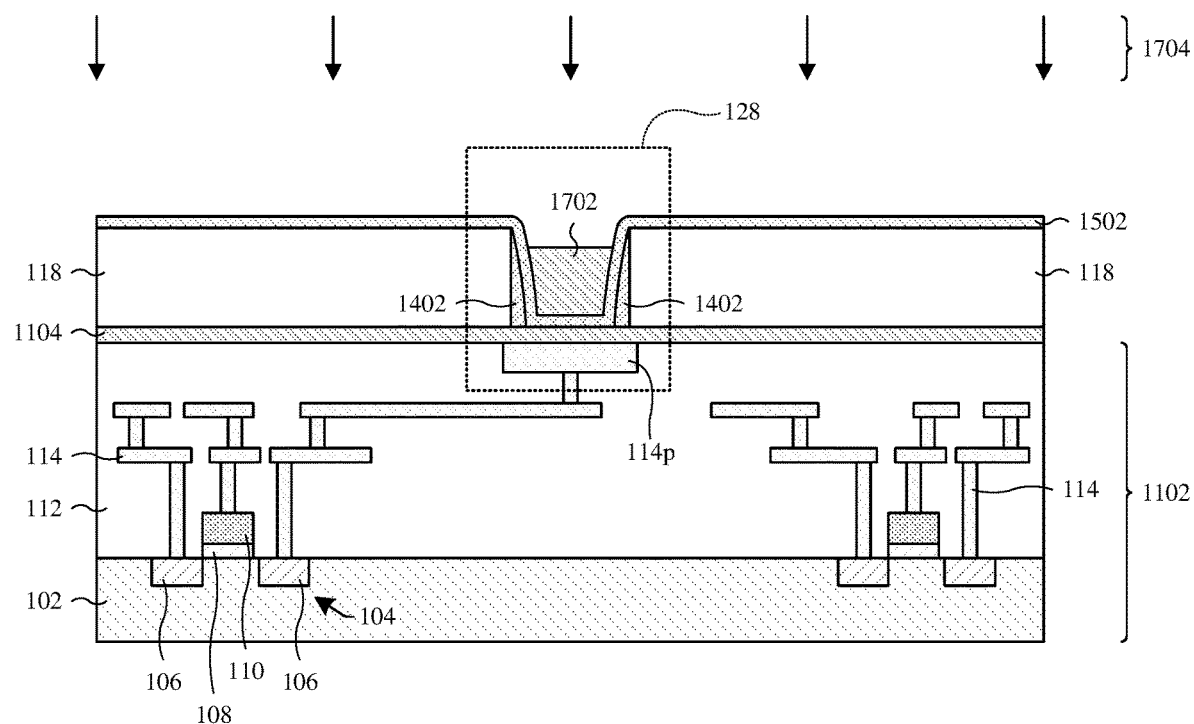
Figure 17B:
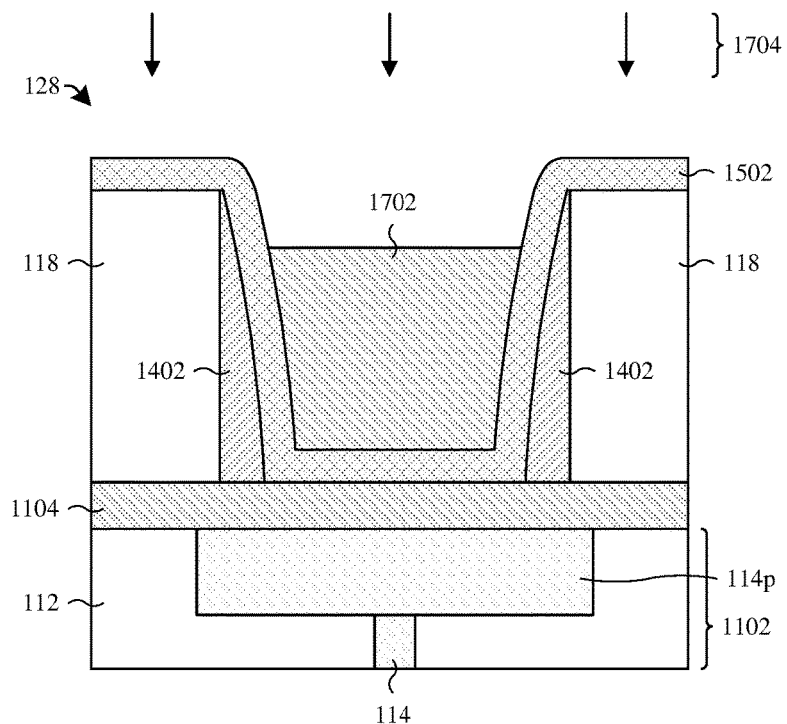

As shown in FIGS. 17A-17B, a second masking structure 1702 is formed over the first dielectric layer 1104 and in the second dielectric structure 118. The second masking structure 1702 is formed directly between the inner sidewalls of the second sidewall barrier structure 1402. In some embodiments, the second masking structure 1702 is formed with an upper surface that is disposed below the upper surface of the second dielectric structure 118. In further embodiments, the second masking structure 1702 is formed directly over the upper conductive pad 114p. In yet further embodiments, the upper surface of the second masking structure 1702 is an uppermost surface of the second masking structure 1702.

In some embodiments, a process for forming the second masking structure 1702 comprises performing a first etching process 1704 (e.g., wet/dry etching process) on the first masking structure 1602 (see, e.g., FIGS. 16A-16B). The first etching process 1704 removes an upper portion of the first masking structure 1602, thereby leaving a lower portion of the first masking structure 1602 between the inner sidewalls of the second sidewall barrier structure 1402 as the second masking structure 1702. In some embodiments, the first etching process 1704 is a dry etching process (e.g., reactive-ion etching). In further embodiments, the first etching process 1704 may be a dry etching process that utilizes oxygen as a processing gas (and/or etchant) (e.g., oxygen plasma etching, oxygen plasma ashing, etc.).

Figure 18A:
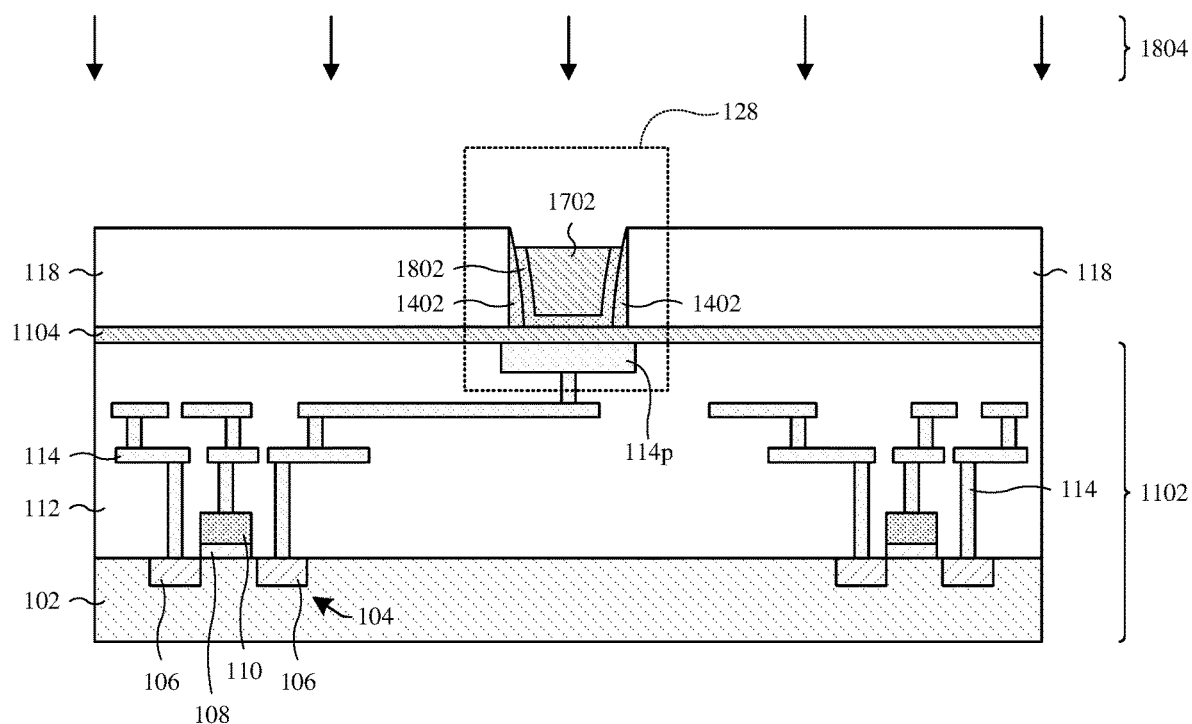
Figure 18B:
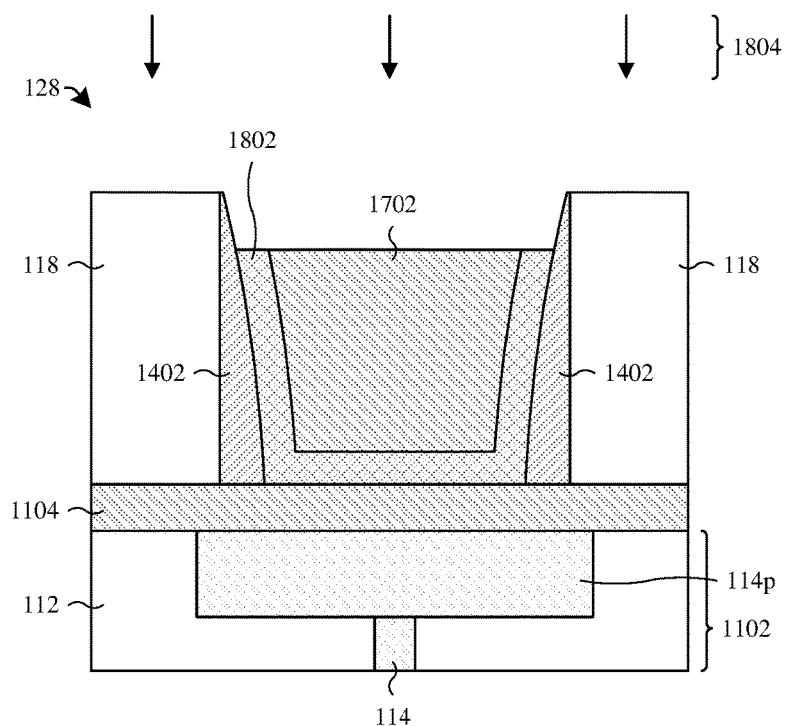

As shown in FIGS. 18A-18B, a hardmask structure 1802 is formed over the first dielectric layer 1104 and in the second dielectric structure 118. The hardmask structure 1802 is formed directly between the inner sidewalls of the second sidewall barrier structure 1402 and separating the second masking structure 1702 from the second sidewall barrier structure 1402. In some embodiments, the hardmask structure 1802 is formed with an upper surface that is substantially planar with the upper surface of the second masking structure 1702. In other embodiments, the hardmask structure 1802 is formed so that the upper surface of the hardmask structure 1802 is disposed over (or below) the upper surface of the second masking structure 1702. In further embodiments, the upper surface of the hardmask structure 1802 is an uppermost surface of the hardmask structure 1802.

In some embodiments, a process for forming the hardmask structure 1802 comprises performing a second etching process 1804 (e.g., wet/dry etching process) on the hardmask layer 1502 (see, e.g., FIGS. 17A-17B). The second etching process 1804 removes an upper portion of the hardmask layer 1502, thereby leaving a lower portion of the hardmask layer 1502 separating the second masking structure 1702 from the second sidewall barrier structure 1402 as the hardmask structure 1802.

In some embodiments, the second etching process 1804 is a wet etching process. In further embodiments, the second etching process 1804 is a wet etching process that utilizes hydrofluoric acid (HF) as an etchant. In such embodiments, the wet etching process comprises exposing the hardmask layer 1502 to a first solution comprising HF. The first solution may have a concentration of about one percent HF. It will be appreciated that the first solution may have a different concentration of HF (e.g., greater/less than about one percent HF). In further such embodiments, the hardmask layer 1502 is exposed to the first solution for a first time interval. In yet further such embodiments, the first time interval may be about sixty seconds. If the first time interval is about sixty second, a height of the hardmask structure 1802 may be controlled such that the upper surface of the hardmask structure 1802 is substantially planar with the upper surface of the second masking structure 1702; if the first time interval is greater/less than about sixty seconds, the height of the hardmask structure 1802 may be reduced/increased such that the upper surface of the hardmask structure 1802 is disposed below/above the upper surface of the second masking structure 1702. It will be appreciated that the first time interval may be any time interval (e.g., greater than sixty seconds) that is sufficient to form the hardmask structure 1802 with a predefined height.

Figure 19A:
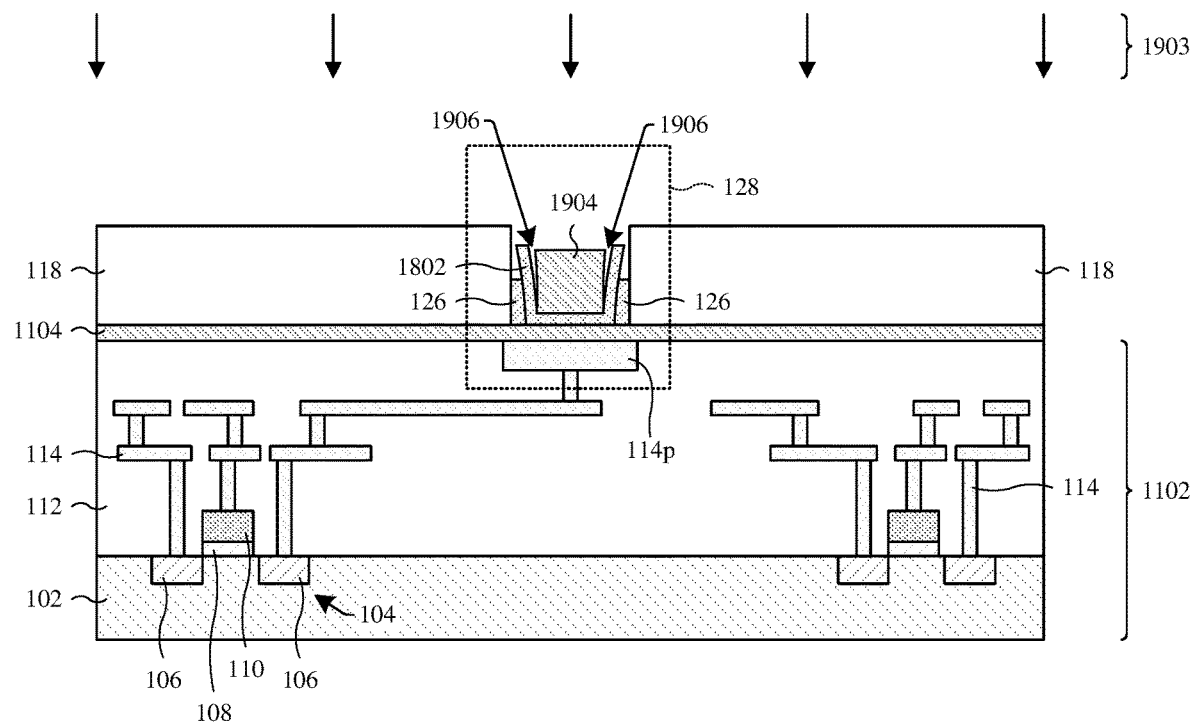
Figure 19B:
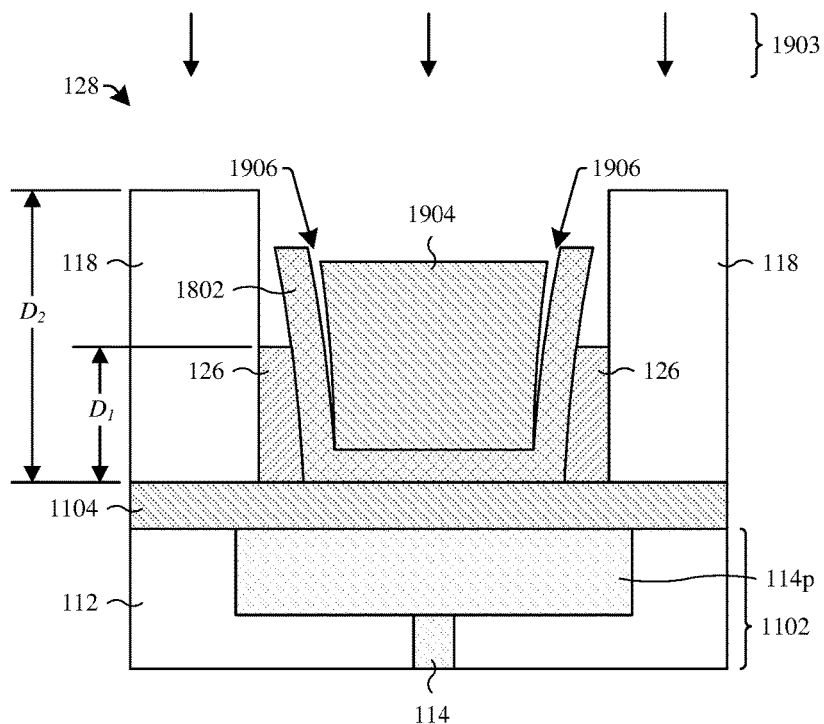

As shown in FIGS. 19A-19B, a first sidewall barrier structure 126 is formed over the first dielectric layer 1104 and in the second dielectric structure 118. The first sidewall barrier structure 126 is formed directly between inner sidewalls of the second dielectric structure 118 and separating the hardmask structure 1802 from the inner sidewalls of the second dielectric structure 118. In some embodiments, the first sidewall barrier structure 126 is formed with an upper surface that is substantially planar.

The first sidewall barrier structure 126 is formed extending vertically a first distance $D_1$ from an upper surface of the first dielectric layer 1104 toward the upper surface of the second dielectric structure 118. The upper surface of the second dielectric structure 118 is vertically spaced from the upper surface of the second dielectric structure 118 by a second distance $D_2$. The first distance $D_1$ is less than the second distance $D_2$. In some embodiments, the first distance $D_1$ is between ten percent and fifty percent of the second distance $D_2$.

In some embodiments, a process for forming the first sidewall barrier structure 126 comprises performing a third etching process 1903 (e.g., dry/wet etching process) on the second sidewall barrier structure 1402 (see, e.g., FIGS. 18A-18B). The third etching process 1903 removes an upper portion of the second sidewall barrier structure 1402, thereby forming the first sidewall barrier structure 126. In some embodiments, the third etching process reduces a height of the second sidewall barrier structure 1402 between fifty percent and ninety percent, thereby forming the first sidewall barrier structure 126. The height of the hardmask structure 1802 and/or the height of the second masking structure 1702 provides a means to control the third etching process 1903, thereby allowing the first sidewall barrier structure 126 to be formed extending vertically the first distance $D_1$ from the upper surface of the first dielectric layer 1104 toward the upper surface of the second dielectric structure 118.

In some embodiments, the third etching process 1903 is a wet etching process. In further embodiments, the third etching process 1903 is a wet etching process that utilizes hydrogen peroxide ($H_2O_2$) as an etchant. In such embodiments, the wet etching process comprises exposing the second sidewall barrier structure 1402 to a second solution comprising $H_2O_2$. The second solution has a different chemical composition than the first solution. The second solution may have a concentration of about thirty percent $H_2O_2$. It will be appreciated that the second solution may comprise a different concentration of $H_2O_2$ (e.g., greater/less than about thirty percent $H_2O_2$). In further such embodiments, the second sidewall barrier structure 1402 is exposed to the second solution for a second time interval. In yet further such embodiments, the second time interval may be about thirty seconds. If the second time interval is about thirty seconds, the first sidewall barrier structure 126 is formed extending vertically the first distance $D_1$ from the upper surface of the first dielectric layer 1104 toward the upper surface of the second dielectric structure 118; if the second time interval is greater/less than about thirty seconds, the first sidewall barrier structure 126 is formed extending vertically a third distance that does not equal the first distance $D_1$ from the upper surface of the first dielectric layer 1104 toward the upper surface of the second dielectric structure 118. It will be appreciated that the second time interval may be any time interval (e.g., greater/less than thirty seconds) that is sufficient to form the first sidewall barrier structure 126 extending vertically the first distance $D_1$ from the upper surface of the first dielectric layer 1104 toward the upper surface of the second dielectric structure 118.

Also shown in FIGS. 19A-19B, a third masking structure 1904 is formed directly between the inner sidewalls of the hardmask structure 1802. In some embodiments, the third masking structure 1904 is formed with an upper surface disposed below the upper surface of the hardmask structure 1802. In further embodiments, the upper surface of the third masking structure 1904 is an uppermost surface of the third masking structure 1904.

Also shown in FIGS. 19A-19B, a crevice 1906 is formed between the third masking structure 1904 and the hardmask structure 1802. The crevice 1906 is a void of material that is disposed between the third masking structure 1904 and the hardmask structure 1802. In some embodiments, sidewalls of the crevice 1906 are defined by outer sidewalls of the third masking structure 1904 and the inner sidewalls of the hardmask structure 1802. In further embodiments, the crevice 1906 extends at least partially from the upper surface of the third masking structure 1904 to a lower surface of the third masking structure 1904. In other embodiments, the crevice 1906 extends fully from the upper surface of the third masking structure 1904 to the lower surface of the third masking structure 1904. In yet further embodiments, the crevice 1906 laterally surrounds the third masking structure 1904.

In some embodiments, a process for forming the third masking structure 1904 and the crevice 1906 comprises performing the third etching process on the second masking structure 1702. The third etching process 1903 removes an upper portion of the second masking structure 1702 and an outer portion of the second masking structure 1702, thereby forming the third masking structure 1904. Because the third etching process 1903 removes the outer portions of the second masking structure 1702, the crevice 1906 is formed between the third masking structure 1904 and the hardmask structure 1802.

Further, because the third etching process 1903 is performed with the hardmask structure 1802 and the second masking structure 1702 in place over the first dielectric layer 1104, the crevice 1906 is formed between the hardmask structure 1802 and the third masking structure 1904. If the hardmask structure 1802 was not in place, the crevice 1906 may be formed between the second masking structure 1702 and the first sidewall barrier structure 126. If the crevice 1906 was between the second masking structure 1702 and the first sidewall barrier structure 126, a portion of the first dielectric layer 1104 may be unintentionally removed, thereby increasing fabrication costs without adding a benefit.

Figure 20A:
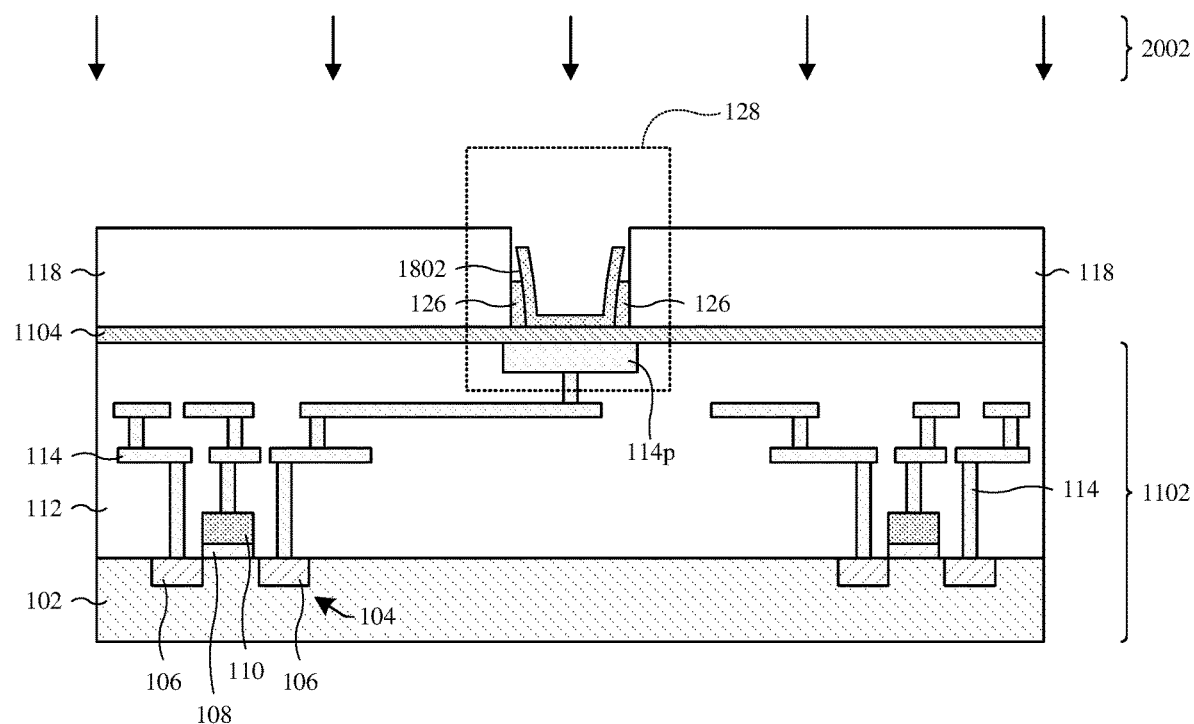
Figure 20B:
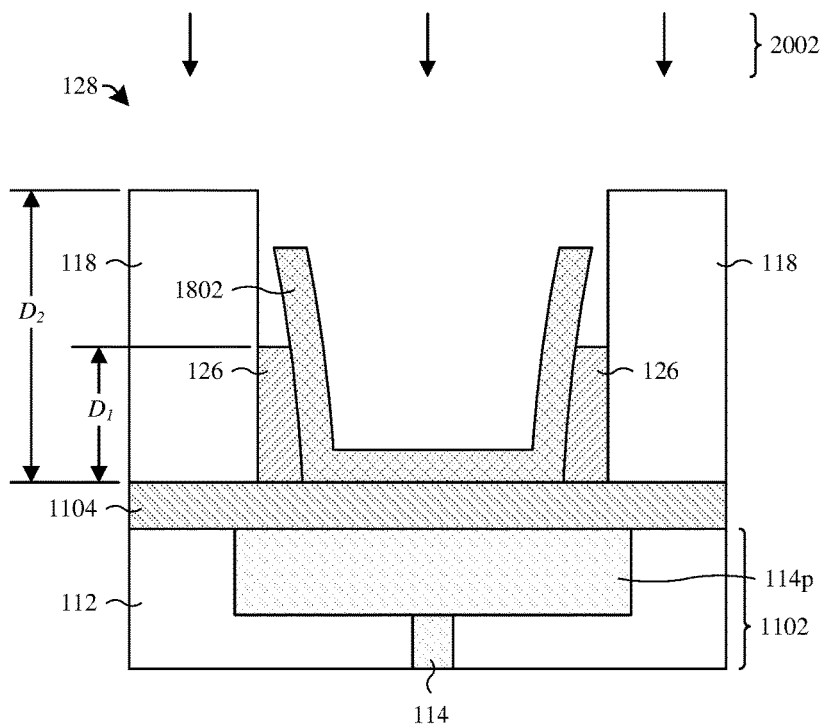

As shown in FIGS. 20A-20B, the third masking structure 1904 (see, e.g., FIGS. 19A-19B) is removed. The third masking structure 1904 is removed from the hardmask structure 1802. In some embodiments, a process for removing the third masking structure 1904 comprises performing a fourth etching process 2002 (e.g., wet/dry etching process) on the third masking structure 1904. In further embodiments, the fourth etching process 2002 is a dry etching process (e.g., reactive-ion etching). In yet further embodiments, the fourth etching process 2002 may be a dry etching process that utilizes oxygen as a processing gas (and/or etchant) (e.g., oxygen plasma etching, oxygen plasma ashing, etc.).

Figure 21A:
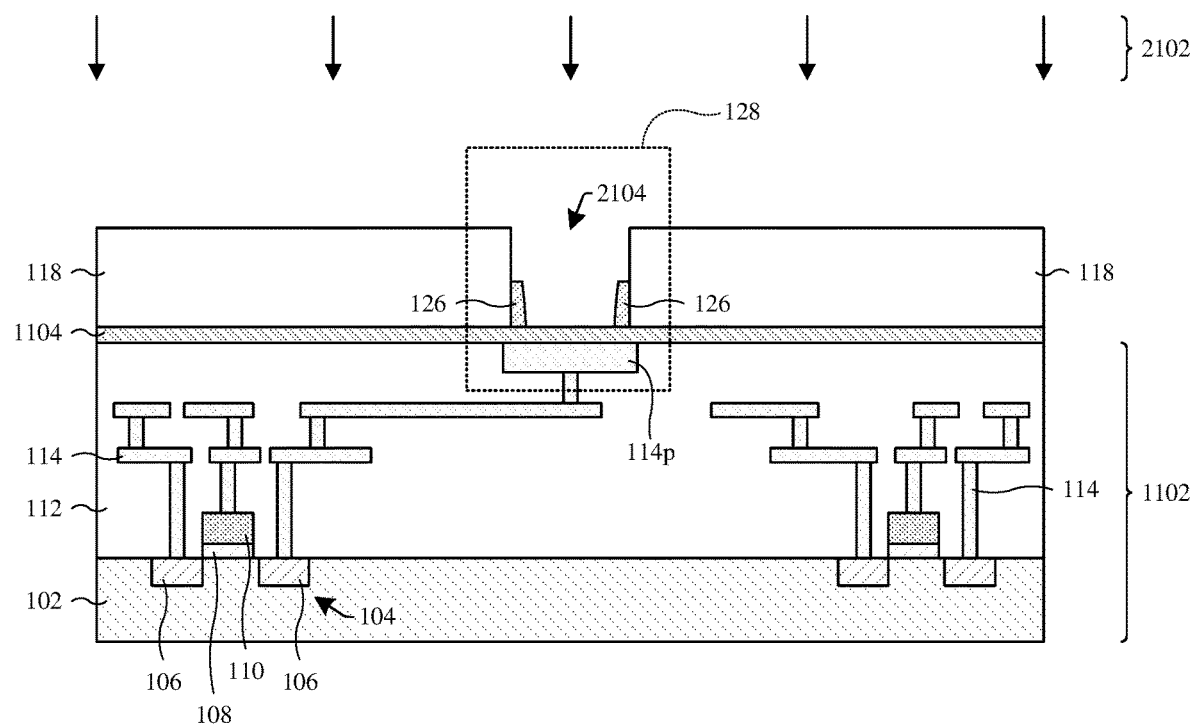
Figure 21B:
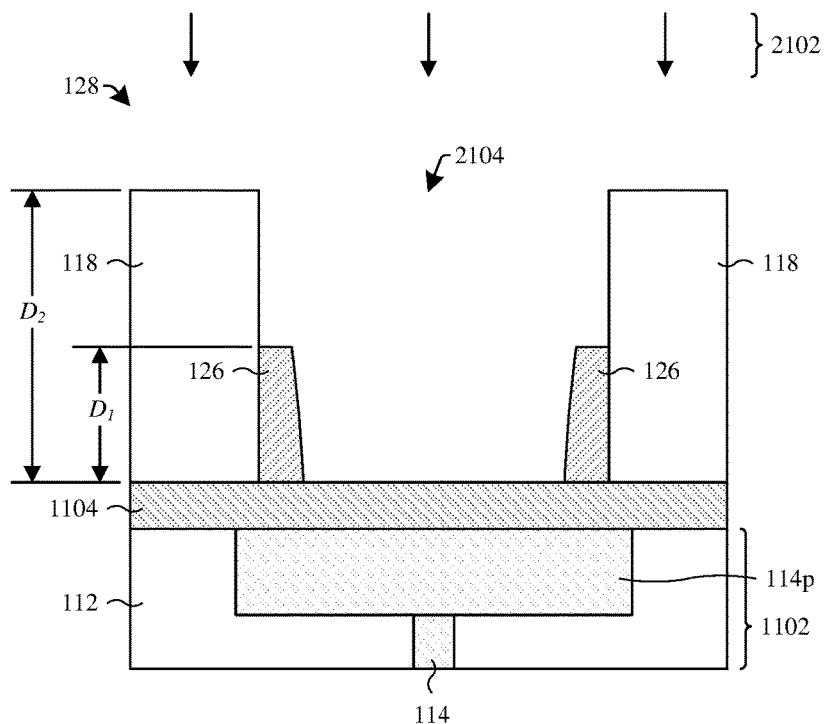

As shown in FIGS. 21A-21B, the hardmask structure 1802 (see, e.g., FIGS. 20A-20B) is removed. The hardmask structure 1802 is removed from the first sidewall barrier structure 126 and the first dielectric layer 1104. In some embodiments, a process for removing the hardmask structure 1802 comprises performing a fifth etching process 2102 (e.g., wet/dry etching process) on the hardmask structure 1802.

In some embodiments, the fifth etching process 2102 is a wet etching process. In further embodiments, the fifth etching process 2102 is a wet etching process that utilizes HF as an etchant. In such embodiments, the wet etching process comprises exposing the third masking structure 1904 to a third solution comprising HF. The third solution may have a concentration of about one percent HF. It will be appreciated that the third solution may have a different concentration of HF (e.g., greater/less than about one percent HF). The third solution may have a same chemical composition as the first solution. In other embodiments, the third solution may have a different chemical composition (e.g., different concentration of HF) as the first solution. In further such embodiments, the third masking structure 1904 is exposed to the third solution for a third time interval. In yet further such embodiments, the third time interval is substantially the same as the first time interval. In other embodiments, the third time interval may be greater than (or less than) the first time interval. It will be appreciated that, in some embodiments, the third masking structure 1904 and the hardmask structure 1802 may be removed by a same etching process.

After the third masking structure 1904 and the hardmask structure 1802 are removed, a fourth opening 2104 is disposed in the second dielectric structure 118 and over the upper conductive pad 114p. The fourth opening 2104 is defined by a first upper portion of the inner sidewalls of the second dielectric structure 118, the upper surface of the first sidewall barrier structure 126, the inner sidewalls of the first sidewall barrier structure 126, and a second central portion of the upper surface of the first dielectric layer 1104. The second central portion of the upper surface of the first dielectric layer 1104 is disposed directly between the inner sidewalls of the first sidewall barrier structure 126. The fourth opening 2104 has a lower region and an upper region disposed over the lower region. In some embodiments, the lower region of the fourth opening 2104 is defined by the inner sidewalls of the first sidewall barrier structure 126 and the second central portion of the upper surface of the first dielectric layer 1104. In further embodiments, the upper region of the fourth opening 2104 is defined by the first upper portion of the inner sidewalls of the second dielectric structure 118 and the upper surface of the first sidewall barrier structure 126. In further embodiments, an uppermost boundary of the upper region of the fourth opening 2104 is disposed at (or below) the upper surface of the second dielectric structure 118. In yet further embodies, an uppermost boundary of the lower region of the fourth opening 2104 is disposed at (or below) the upper surface of the first sidewall barrier structure 126.

Figure 22A:
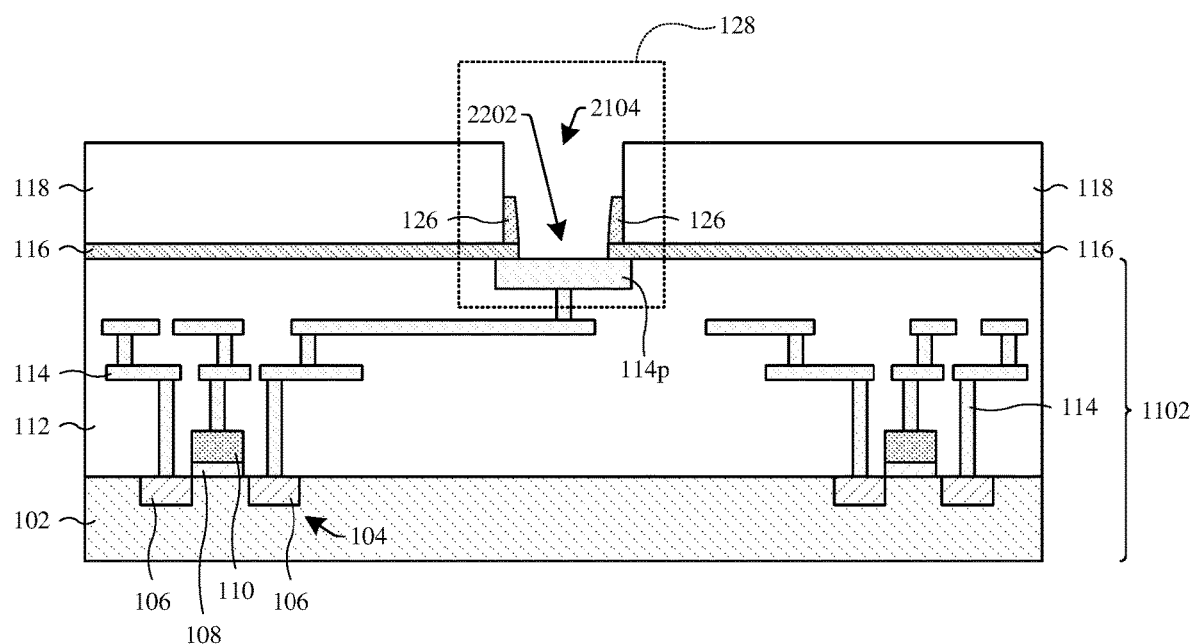
Figure 22B:
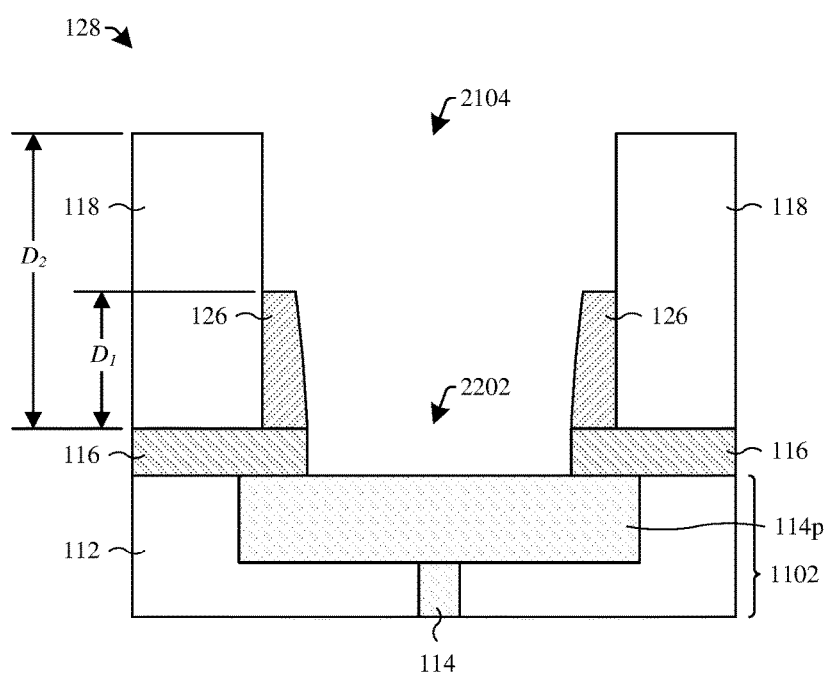

As shown in FIGS. 22A-22B, a first dielectric structure 116 is formed between the second dielectric structure 118 and the ILD structure 112. The first dielectric structure 116 is also formed between the first sidewall barrier structure 126 and the upper conductive pad 114p. The first dielectric structure 116 is formed with inner sidewalls that are laterally spaced apart. In some embodiments, the inner sidewalls of the first dielectric structure 116 are substantially aligned with the inner sidewalls of the first sidewall barrier structure

126. In further embodiments, the inner sidewalls of the first dielectric structure 116 are substantially vertical.

In some embodiments, a process for forming the first dielectric structure 116 comprises performing an etching process (e.g., dry/wet etching process) on the first dielectric layer 1104 (see, e.g., FIGS. 21A-21B). The process for forming the first dielectric structure 116 removes a central region of the first dielectric layer 1104, thereby forming the first dielectric layer 1104. The central region of the first dielectric layer 1104 is disposed at least partially between the inner sidewalls of the first sidewall barrier structure 126. In further embodiments, during the etching process, the second dielectric structure 118 and the first sidewall barrier structure 126 act as a masking structure so that the etching process removes the central region of the first dielectric layer 1104, thereby leaving masked portions of the first dielectric layer 1104 in place as the first dielectric structure 116.

After the first dielectric structure 116 is formed, a fifth opening 2202 is disposed in the first dielectric structure 116 and between the fourth opening 2104 and the upper conductive pad 114p. The fifth opening 2202 is defined by a third central portion of an upper surface of the upper conductive pad 114p and the inner sidewalls of the first dielectric structure 116. In some embodiments, an uppermost boundary of the fifth opening 2202 is disposed at (or below) an upper surface of the first dielectric structure 116. In some embodiments, an outer perimeter of the fifth opening 2202 is disposed within an outer perimeter of the fourth opening 2104.

Figure 23A:
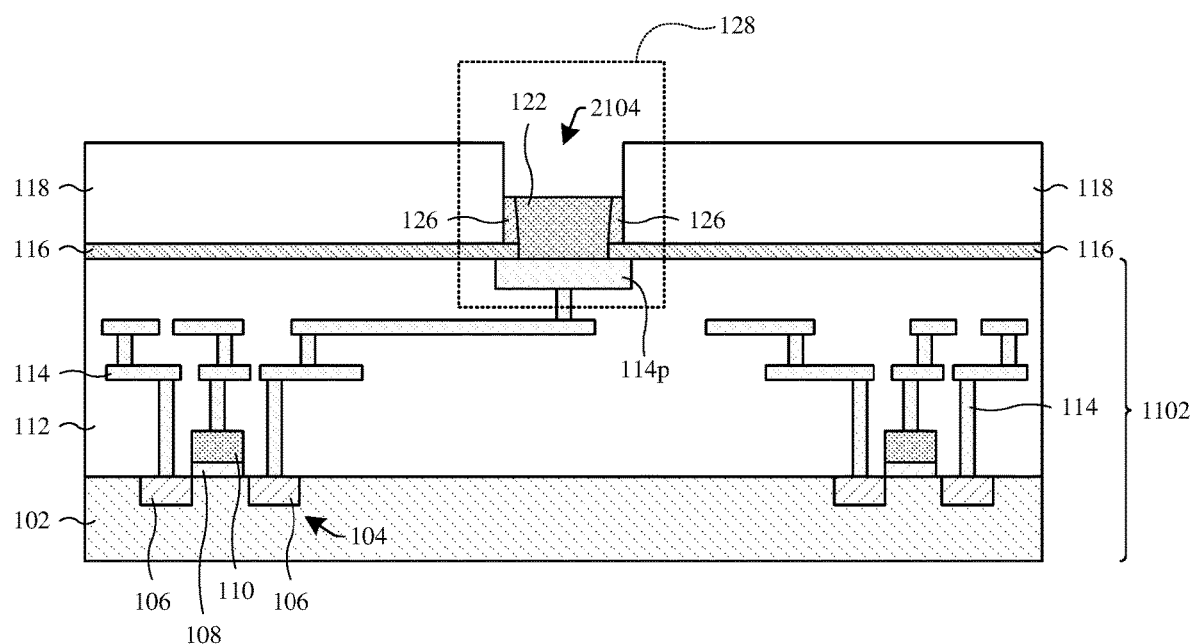
Figure 23B:
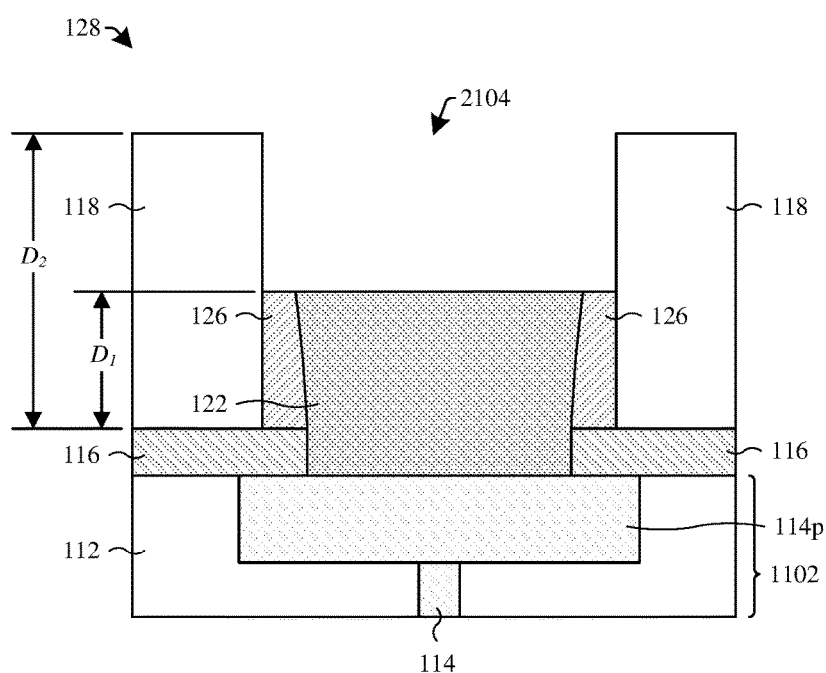

As shown in FIGS. 23A-23B, a lower bumping structure 122 is formed over ILD structure 112 and the upper conductive pad 114p. In some embodiments, the lower bumping structure 122 is formed on the upper conductive pad 114p. The lower bumping structure 122 is formed between the inner sidewalls of the first dielectric structure 116 and the inner sidewalls of the first sidewall barrier structure 126. In some embodiments, the lower bumping structure 122 is formed with an upper surface that is substantially co-planar with the upper surface of the first sidewall barrier structure 126. In other embodiments, the lower bumping structure 122 is formed so that the upper surface of the lower bumping structure 122 is disposed over (or below) the upper surface of the first sidewall barrier structure 126. In further embodiments, the lower bumping structure 122 is formed contacting the upper surface of the upper conductive pad 114p, the inner sidewalls of the first dielectric structure 116, and the inner sidewalls of the first sidewall barrier structure 126. In further embodiments, the lower bumping structure 122 is formed contacting the inner sidewalls of the second dielectric structure 118.

In some embodiments, a process for forming the lower bumping structure 122 comprises depositing a first conductive material on the upper conductive pad 114p, in the fifth opening 2202 (see, e.g., FIGS. 22A-22B), and partially in the fourth opening 2104 (e.g., the lower region of the fourth opening 2104), thereby forming the lower bumping structure 122 over the upper conductive pad 114p and vertically extending toward the upper surface of the second dielectric structure 118. In some embodiments, the first conductive material may be or comprise, for example, Ni, a Ni alloy, some other suitable metal, or a combination of the foregoing. The first conductive material may be deposited by, for example, CVD, PVD, ALD, sputtering, electrochemical plating, electroless plating, some other deposition process, or a combination of the foregoing. In further embodiments, the first conductive material is deposited by an electroplating process.

Figure 24A:
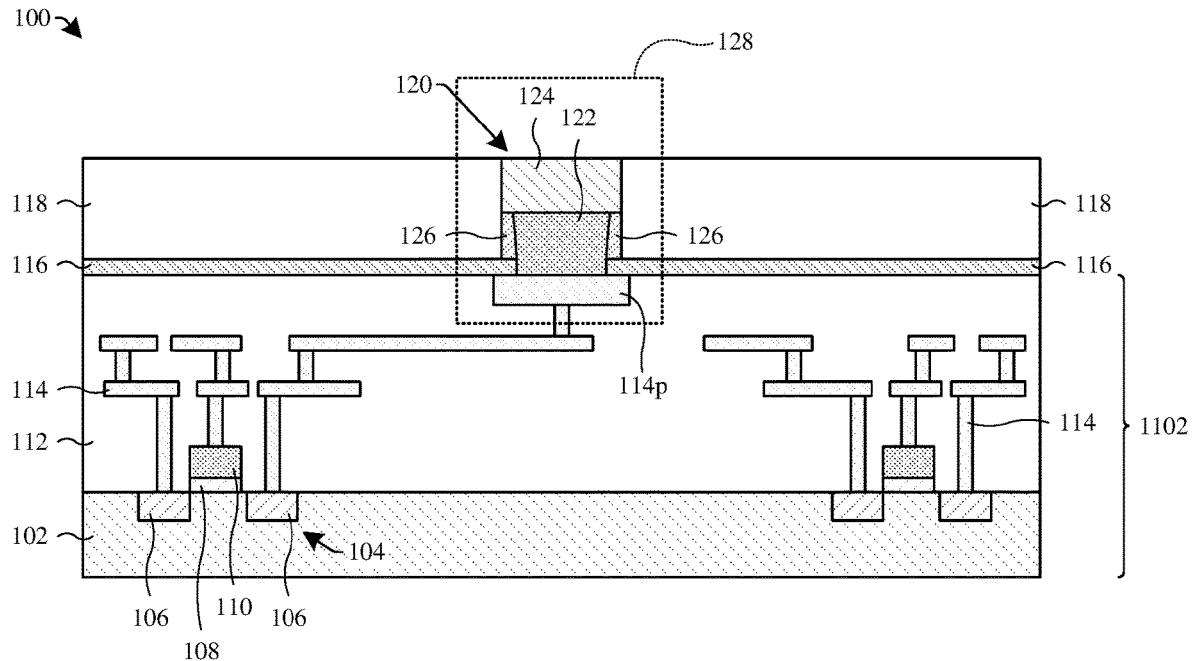
Figure 24B:
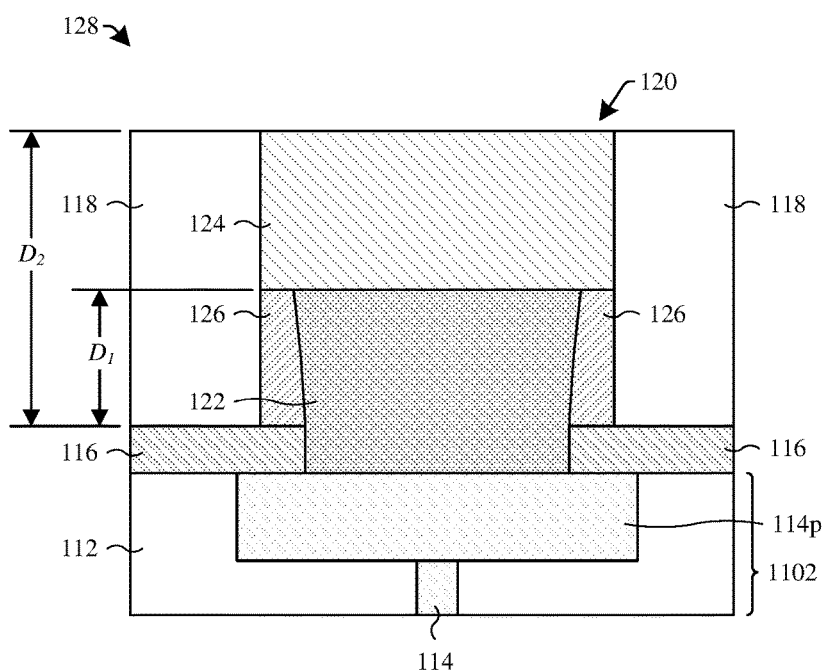

As shown in FIGS. 24A-24B, an upper bumping structure 124 is formed over the lower bumping structure 122 and the first sidewall barrier structure 126. In some embodiments, the upper bumping structure 124 is formed on the lower bumping structure 122 and on the first sidewall barrier structure 126. The upper bumping structure 124 is formed between the inner sidewalls of the second dielectric structure 118. The upper bumping structure 124 is formed with an upper surface that is substantially co-planar (or disposed below) the upper surface of the second dielectric structure 118. In some embodiments, the upper bumping structure 124 is formed so that the upper surface of the upper bumping structure 124 does not extend above the upper surface of the second dielectric structure 118. In further embodiments, the upper bumping structure 124 is formed contacting the upper surface of the lower bumping structure 122 and the inner sidewalls of the second dielectric structure 118. In further embodiments, the upper bumping structure 124 is formed contacting the upper surface of the first sidewall barrier structure 126. In yet further embodiments, the upper bumping structure 124 is formed contacting the inner sidewalls of the first sidewall barrier structure 126.

In some embodiments, a process for forming the upper bumping structure 124 comprises depositing a second conductive material on the lower bumping structure 122, on the first sidewall barrier structure 126, and partially in the fourth opening 2104 (e.g., the upper region of the fourth opening 2104 (see, e.g., FIGS. 23A-23B)), thereby forming the upper bumping structure 124 over both the lower bumping structure 122 and the first sidewall barrier structure 126 and vertically extending toward the upper surface of the second dielectric structure 118. The second conductive material is different than the first conductive material. In some embodiments, the second conductive material may be or comprise, for example, Au, Pt, some other suitable metal, or a combination of the foregoing. In further embodiments, the first conductive material is Ni and the second conductive material is Au. The second conductive material may be deposited by, for example, CVD, PVD, ALD, sputtering, electrochemical plating, electroless plating, some other deposition process, or a combination of the foregoing. In further embodiments, the second conductive material is deposited by an electroplating process.

In some embodiments, after the upper bumping structure 124 is formed, formation of the bumping structure 120 is complete. The bumping structure 120 comprises the lower bumping structure 122 and the upper bumping structure 124. In further embodiments, after the upper bumping structure 124 is formed, formation of the IC 100 is complete.

Figure 25:
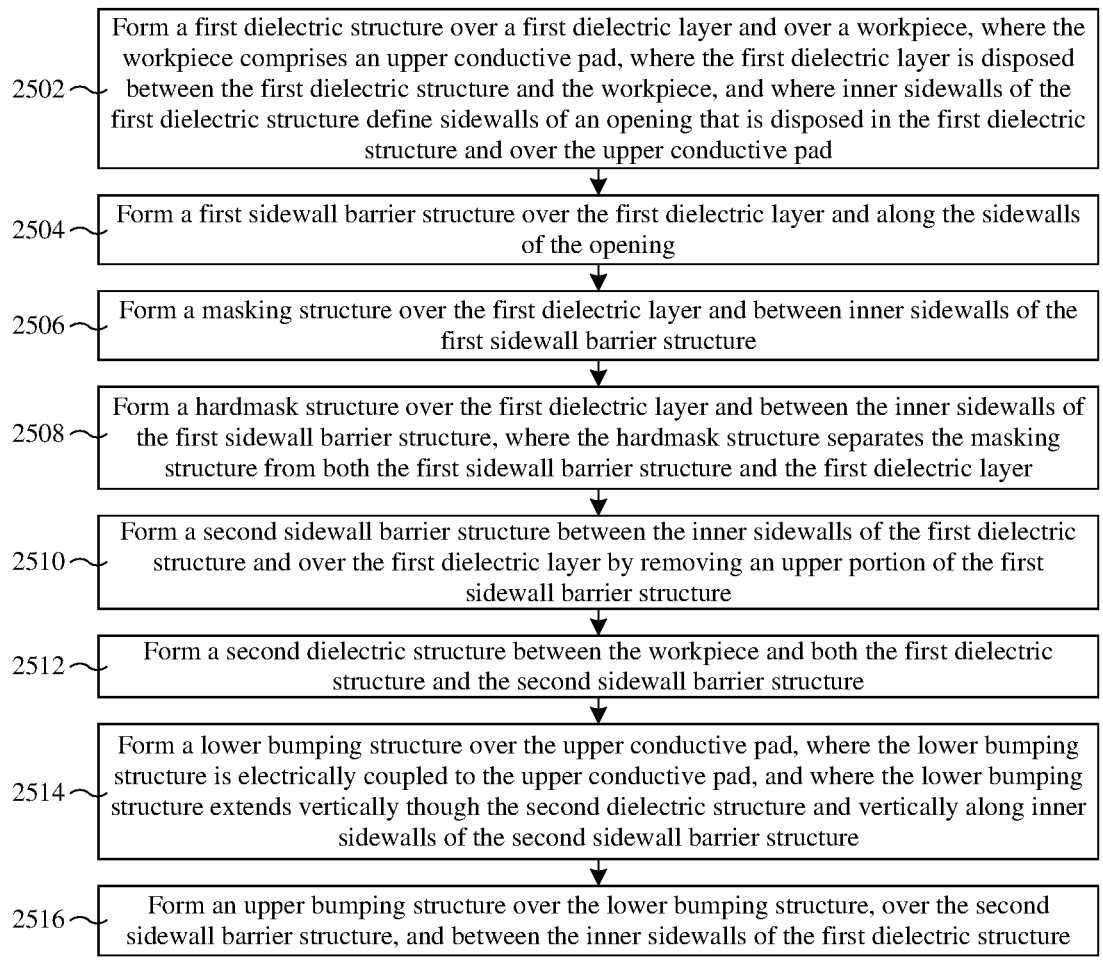
FIG. 25 illustrates a flowchart of some embodiments of a method for forming some embodiments of the IC of FIG. 1.

FIG. 25 illustrates a flowchart 2500 of some embodiments of a method for forming some embodiments of the IC 100 of FIG. 1. While the flowchart 2500 of FIG. 25 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2502, a first dielectric structure is formed over a first dielectric layer and over a workpiece, where the workpiece comprises an upper conductive pad, where the first dielectric layer is disposed between the first dielectric structure and the workpiece, and where inner sidewalls of the first dielectric structure define sidewalls of an opening that is disposed in the first dielectric structure and over the upper conductive pad. FIGS. 11A-11B through FIGS. 12A-12B illustrate a series of various cross-sectional views of some embodiments corresponding to act 2502.

At act 2504, a first sidewall barrier structure is formed over the first dielectric layer and along the sidewalls of the opening. FIGS. 13A-13B through FIGS. 14A-14B illustrate a series of various cross-sectional views of some embodiments corresponding to act 2504.

At act 2506, a masking structure is formed over the first dielectric layer and between the inner sidewalls of the first sidewall barrier structure. FIGS. 15A-15B through FIGS. 17A-17B illustrate a series of various cross-sectional views of some embodiments corresponding to act 2506.

At act 2508, a hardmask structure is formed over the first dielectric layer and between the inner sidewalls of the first sidewall barrier structure, where the hardmask structure separates the masking structure from both the first sidewall barrier structure and the first dielectric structure. FIGS. 15A-15B through FIGS. 18A-18B illustrate a series of various cross-sectional views of some embodiments corresponding to act 2508.

At act 2510, a second sidewall barrier structure is formed between the inner sidewalls of the first dielectric structure and over the first dielectric layer by removing an upper portion of the first sidewall barrier structure. FIGS. 19A-19B illustrate various cross-sectional views of some embodiments corresponding to act 2510.

At act 2512, a second dielectric structure is formed between the workpiece and both the first dielectric structure and the second sidewall barrier structure. FIGS. 20A-20B through FIGS. 22A-22B illustrate a series of various cross-sectional views of some embodiments corresponding to act 2512.

At act 2514, a lower bumping structure is formed over the upper conductive pad, where the lower bumping structure is electrically coupled to the upper conductive pad, and where the lower bumping structure extends vertically though the second dielectric structure and vertically along inner sidewalls of the second sidewall barrier structure. FIGS. 23A-23B illustrate various cross-sectional views of some embodiments corresponding to act 2514.

At act 2516, an upper bumping structure is formed over the lower bumping structure, over the second sidewall barrier structure, and between the inner sidewalls of the first dielectric structure. FIGS. 24A-24B illustrate various cross-sectional views of some embodiments corresponding to act 2516.

Figure 26A:
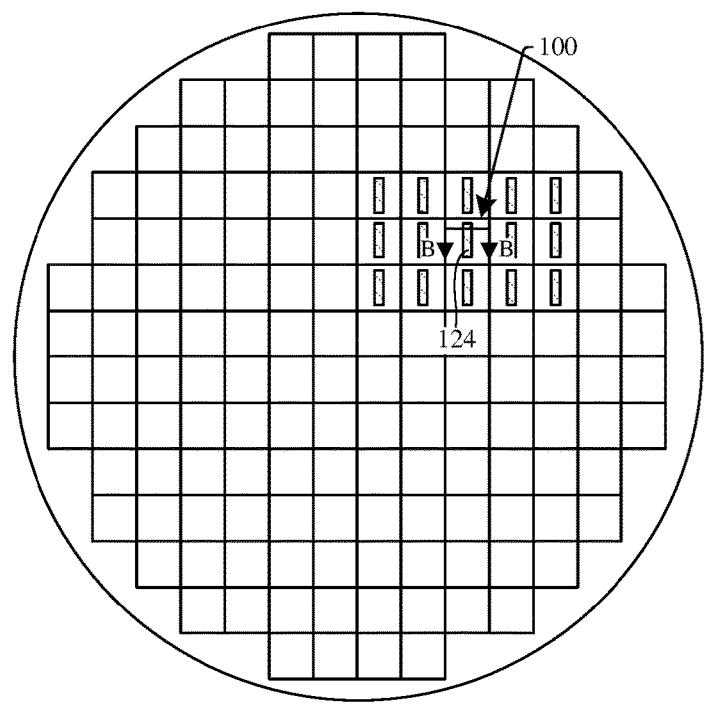
FIGS. 26A-26B through 28A-28B illustrate a series of various views of some embodiments of a method for forming a first singulated die comprising some embodiments of the IC of FIG. 1.
Figure 26B:
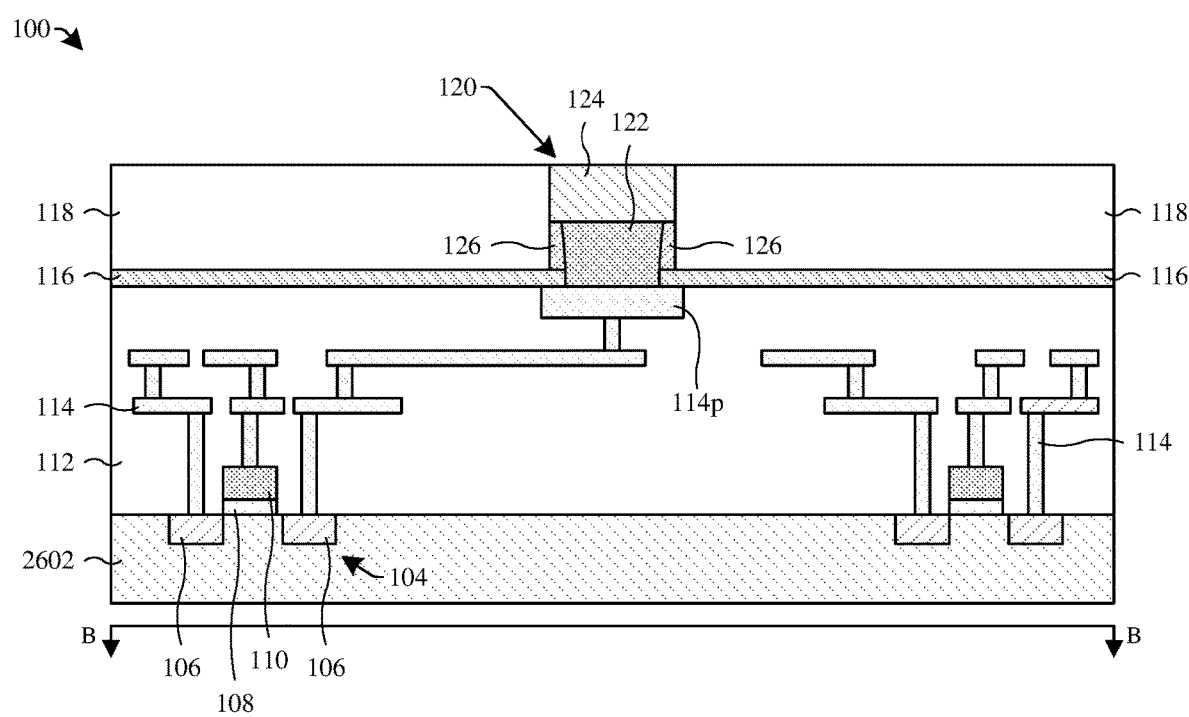

FIGS. 26A-26B through 28A-28B illustrate a series of various views of some embodiments of a method for forming a first singulated die comprising some embodiments of the IC 100 of FIG. 1. Figures with a suffix of "A" (e.g., FIG. 26A) illustrate a series of layout views of some embodiments of the method for forming a first singulated die comprising some embodiments of the IC 100 of FIG. 1. Figures with a suffix of "B" (e.g., FIG. 26B) illustrate a series of cross-sectional views of a corresponding figure having a suffix of "A" taken along line B-B of the corresponding figure. For example, FIG. 26B illustrates a cross-sectional view of the IC 100 of FIG. 26A taken along line B-B of FIG. 26A, FIG. 27B illustrates a cross-sectional view of the IC 100 of FIG. 27A taken along line B-B of FIG. 27A, and so forth.

As shown in FIGS. 26A-26B, a plurality of ICs (not labeled for ease of illustration) are disposed on a semiconductor wafer 2602. The plurality of ICs are disposed on the semiconductor wafer 2602 in an array. The IC 100 is one of the plurality of ICs. In some embodiments, each of the ICs of the plurality of ICs comprise a bumping structure (e.g., the bumping structure 120), which comprises a lower bumping structure (e.g., the lower bumping structure 122) and an upper bumping structure (e.g., the upper bumping structure 124), disposed at least partially in a second dielectric structure (e.g., the second dielectric structure 118). The semiconductor wafer 2602 comprises any type of semiconductor body (e.g., monocrystalline silicon/CMOS bulk, silicon-germanium (SiGe), silicon on insulator (SOI), etc.). In some embodiments, the semiconductor wafer 2602 is disk-shaped.

Figure 27A:
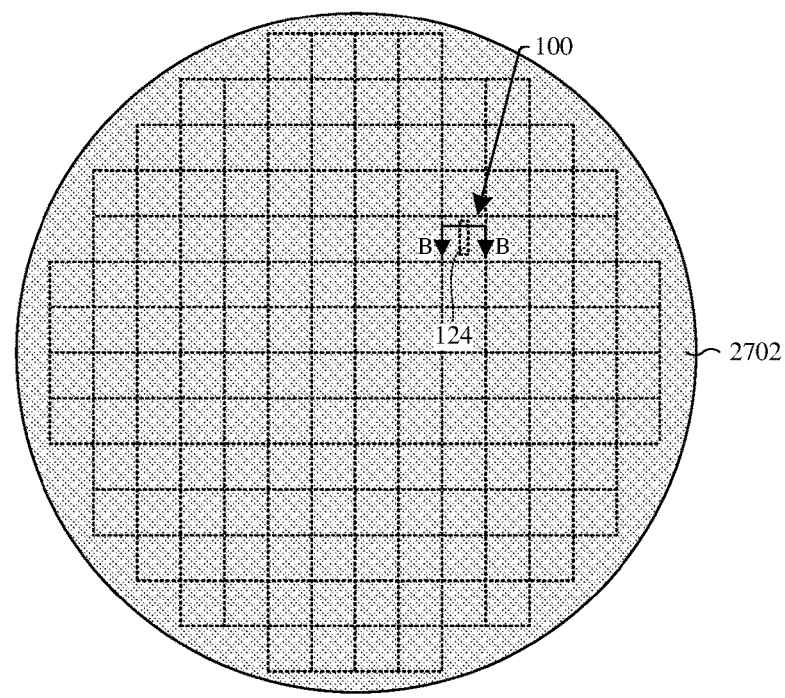
Figure 27B:
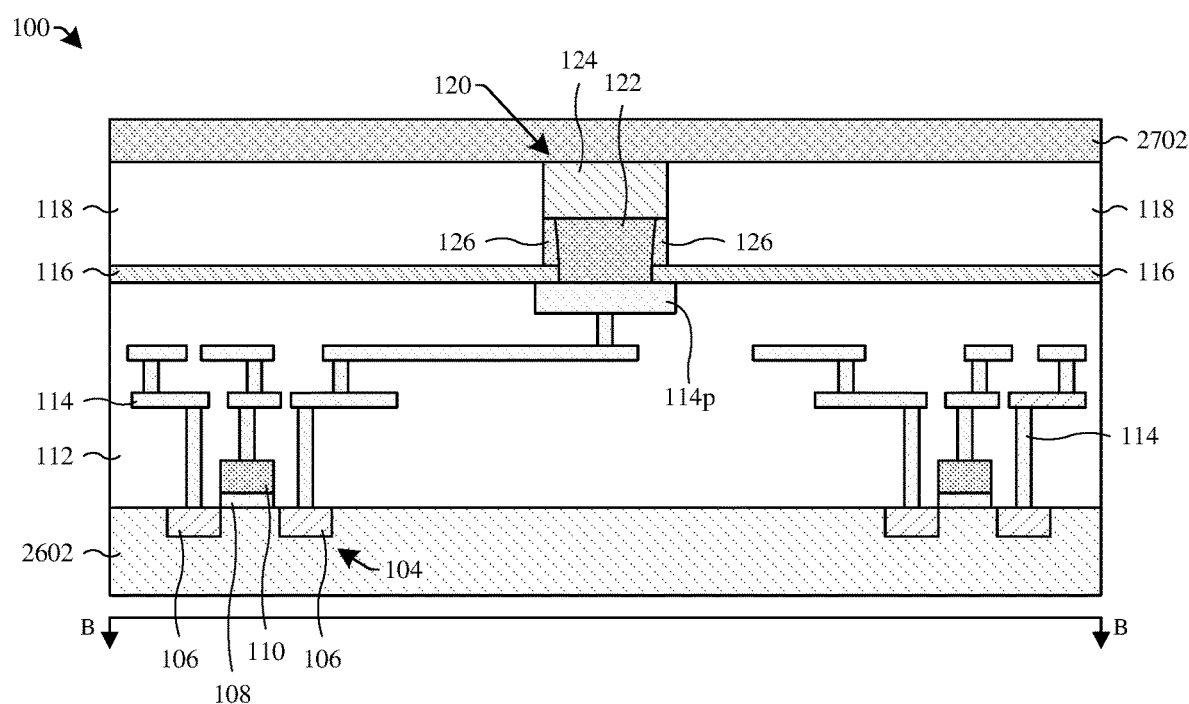

As shown in FIGS. 27A-27B, a carrier wafer 2702 is bonded to the semiconductor wafer 2602. In some embodiments, the carrier wafer 2702 is disk-shaped. The carrier wafer 2702 may be, for example, a polyimide wafer, semiconductor wafer, or the like. In some embodiments, a process for bonding the carrier wafer 2702 to the semiconductor wafer 2602 comprises bonding the carrier wafer 2702 to the second dielectric structures (e.g., via a temporary bonding process) of the plurality of ICs and/or the upper bumping structures of the plurality of ICs. Because the ICs of the plurality of ICs comprise the bumping structures, the process of bonding the carrier wafer 2702 to the semiconductor wafer 2602 (e.g., via bonding the carrier wafer 2702 to the second dielectric structures of the plurality of ICs and/or the upper bumping structures of the plurality of ICs) may be improved due to uppermost points of the upper bumping structures being disposed at or below uppermost points of the second dielectric structures, thereby improving yield (e.g., by preventing damage to the ICs during bonding, preventing unintentional debonding of the carrier wafer, etc.).

Figure 28A:
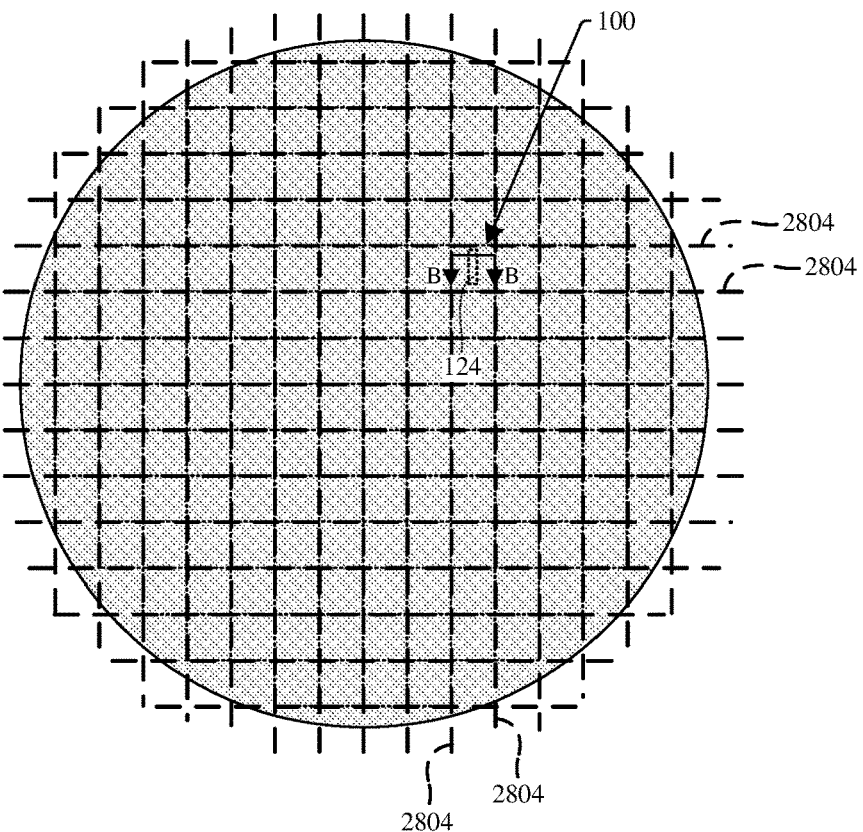
Figure 28B:
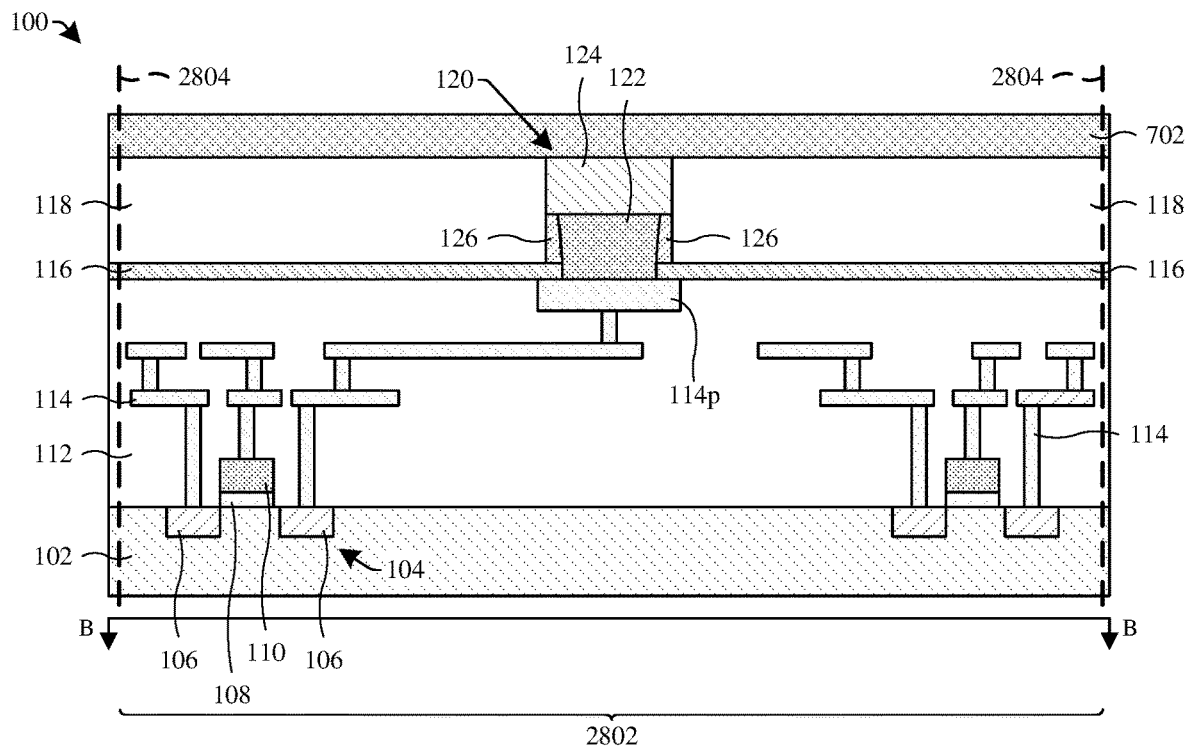

As shown in FIGS. 28A-28B, with the carrier wafer 2702 bonded to the semiconductor wafer 2602, a wafer dicing process is performed on the bonded together carrier wafer 2702 and semiconductor wafer 2602 (see, e.g., FIGS. 27A-27B) to singulate the ICs of the plurality of ICs from the bonded together carrier wafer 2702 and semiconductor wafer 2602, thereby forming a first plurality of singulated dies. The first plurality of singulated dies comprise the plurality of ICs, respectively. For example, the IC 100 is singulated from the bonded together carrier wafer 2702 and semiconductor wafer 2602 to form a first singulated die 2802 comprising the IC 100. In some embodiments, the wafer dicing process comprises performing a series of cuts into the bonded together carrier wafer 2702 and semiconductor wafer 2602 to form a plurality of scribe lines 2804, each of which are disposed on a side of the ICs of the plurality of ICs. Subsequently, a mechanical force is applied to the bonded together carrier wafer 2702 and semiconductor wafer 2602 to singulate the ICs of the plurality of ICs, thereby forming the first plurality of singulated dies. In further embodiments, the cuts may be performed by, for example, mechanical sawing, laser cutting, or the like.

In some embodiments, after the plurality of singulated dies are formed, each of the singulated dies of the plurality of singulated dies comprises a semiconductor substrate and a carrier substrate. For example, the first singulated die 2802 comprises the semiconductor substrate 102 and the carrier substrate 702 (see, e.g., FIG. 7A). In some embodiments, the semiconductor substrate 102 is a portion of the semiconductor wafer 2602 that has been singulated from the semiconductor wafer 2602 via the wafer dicing process. In further embodiments, the carrier substrate 702 is a portion of the carrier wafer 2702 that has been singulated from the carrier wafer 2702 via the wafer dicing process. The first singulated die 2802 may have a square-shaped (or rectangular-shaped) layout. The semiconductor substrate 102 may have a square-shaped (or rectangular-shaped) layout. The carrier substrate 702 may have a square-shaped (or rectangular-shaped) layout. In some embodiments, the layout of the semiconductor substrate 102 and the layout of the carrier substrate 702 are substantially the same (e.g., having an area and a layout shape that are substantially the same). After the first singulated die 2802 is formed, the carrier substrate 702 may be removed (e.g., debonded) from the IC 100 via a subsequent removal process. It will be appreciated that, in some embodiments, the carrier wafer 2702 may be removed (e.g., debonded) before the wafer dicing process is performed. In such embodiments, after the plurality of singulated dies are formed, the singulated dies of the plurality of singulated dies do not comprise carrier substrates.

Figure 29:
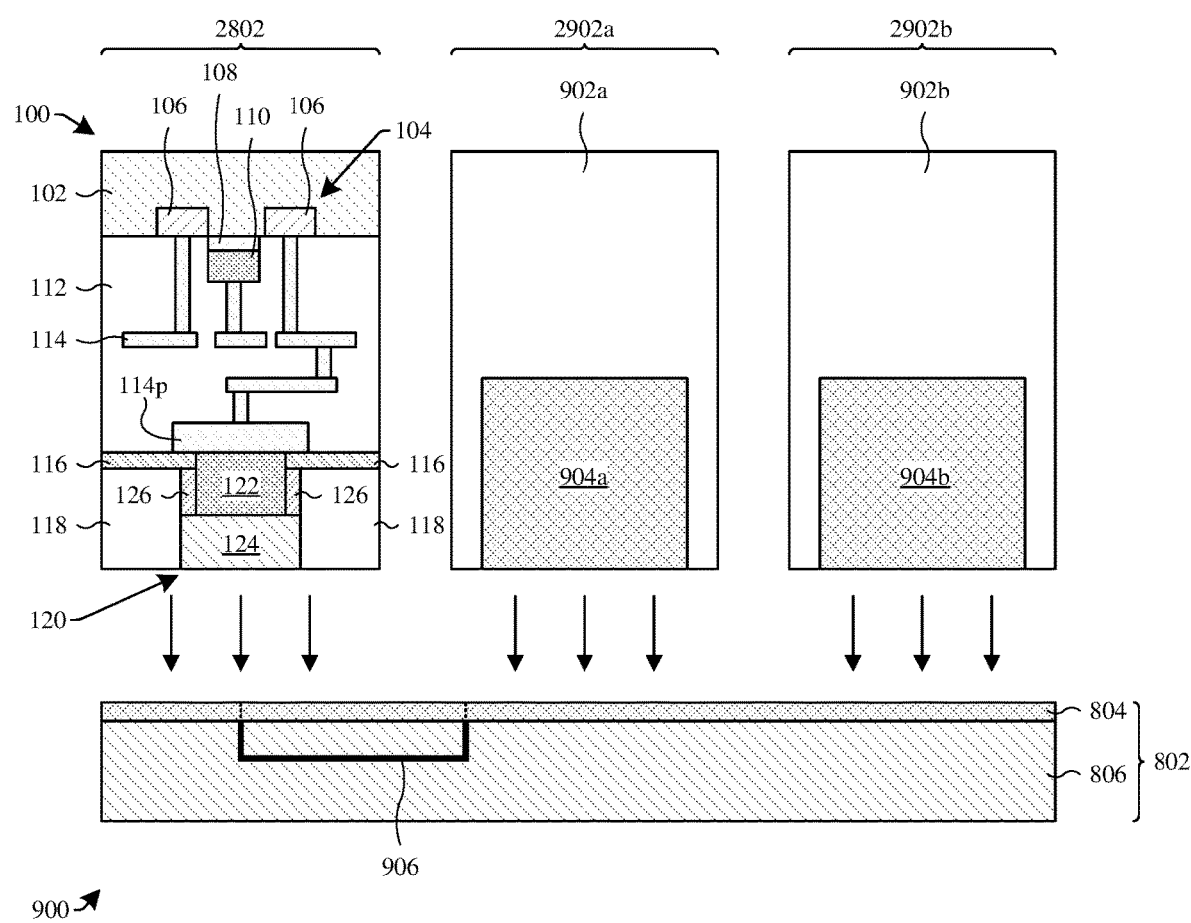
FIG. 29 illustrates a cross-sectional view of some embodiments of a method for forming a display device comprising the first singulated die formed in FIGS. 26A-26B through 28A-28B.

FIG. 29 illustrates a cross-sectional view of some embodiments of a method for forming a display device 900 comprising the first singulated die 2802 formed in FIGS. 26A-26B through 28A-28B.

As shown in FIG. 29, the first singulated die 2802 is bonded to a screen panel 802 (see, e.g., FIG. 8). It will be appreciated that the first singulated die 2802 is not limited to comprising the embodiment of the IC 100 illustrated in FIGS. 26A-26B through 28A-28B, rather the first singulated die 2802 may comprise other embodiments of the IC 100 (see, e.g., FIGS. 1-6). In some embodiments, before the first singulated die 2802 is bonded to the screen panel 802 the carrier substrate 702 is removed from the first singulated die 2802 (e.g., via a suitable debonding process, such as a laser debonding process). In some embodiments, the screen panel 802 comprises a transparent bonding layer 804 and a transparent cover structure 806. In further embodiments, one or more second conductive features 906 (e.g., conductive lines) are disposed in the transparent cover structure 806. Further, a second plurality of singulated dies 2902a-b are bonded to the screen panel 802. The second plurality of singulated dies 2902a-b comprise the plurality of light-emitting ICs 902a-c, respectively. For example, a second singulated die 2902a comprises a first light-emitting IC 902a, and a third singulated die 2902b comprises a second light-emitting IC 902b. It will be appreciated that, in other embodiments, one or more of the plurality of light-emitting ICs 902a-c may be disposed on one of the second plurality of singulated dies.

In some embodiments, a process for bonding the first singulated die 2802 and the second plurality of singulated dies 2902a-b to the screen panel 802 comprises transferring the first singulated die 2802 and the second plurality of singulated dies 2902a-b onto the screen panel 802 via a transferring process, thereby bonding the first singulated die 2802 and the second plurality of singulated dies 2902a-b to the screen panel 802. For example, the transferring process comprises picking up the first singulated die 2802, the second singulated die 2902, and the third singulated die 2902b from a first location and transferring the first singulated die 2802, the second singulated die 2902, and the third singulated die 2902b onto the transparent bonding layer 804, thereby bonding the first singulated die 2802, the second singulated die 2902a, and the third singulated die 2902b to the screen panel 802. Because the first singulated die 2802, the second singulated die 2902a, and the third singulated die 2902b are bonded to the screen panel 802, the IC 100, the first light-emitting IC 902a, and the second light-emitting IC 902b are also bonded to the screen panel 802.

In some embodiments, the transferring process may be, for example, a pick-and-place transfer process, an elastomer stamp (or roll) process, an electrostatic stamp process, some other suitable transferring process, or a combination of the foregoing. It will be appreciated that the first singulated die 2802, the second singulated die 2902a, and the third singulated die 2902b may be bonded to the screen panel 802 via multiple transferring processes. The first singulated die 2802, the second singulated die 2902a, and the third singulated die 2902b are bonded to the screen panel 802 in a predefined pattern (e.g., a 5×5 array) so that the one or more second conductive features 906 electrically coupled the light-emitting ICs 902a-c to the IC 100.

Because the IC 100 comprises the bumping structure 120, an improved bond interface between the first singulated die 2802 and the screen panel 802 exists. For example, because the upper bumping structure 124 does not have the "fence" structure 502 (see, e.g., FIG. 5) that extends over the upper surface of the second dielectric structure 118, the bond interface between the first singulated die 2802 and the screen panel 802 is improved. The improved bond interface may improve robustness of the display device 900 (e.g., resistance of the screen panel 802 to crack/shatter/delaminate in response to a given mechanical force being applied on the transparent cover structure 806) and/or yield of the display device 900. For example, the improved bond interface may improve the robustness of the display device 900 and/or yield of the display device 900 due to the bumping structure 120 reducing high-stress points that may cause cracking/shattering/delamination of the screen panel 802 during fabrication (or during consumer use) of the display device 900 (e.g., due to the reduction in high-stress points increasing an amount of mechanical force that can be applied on the transparent cover structure 806 before cracking/shattering/delamination of the screen panel 802).

Figure 30:
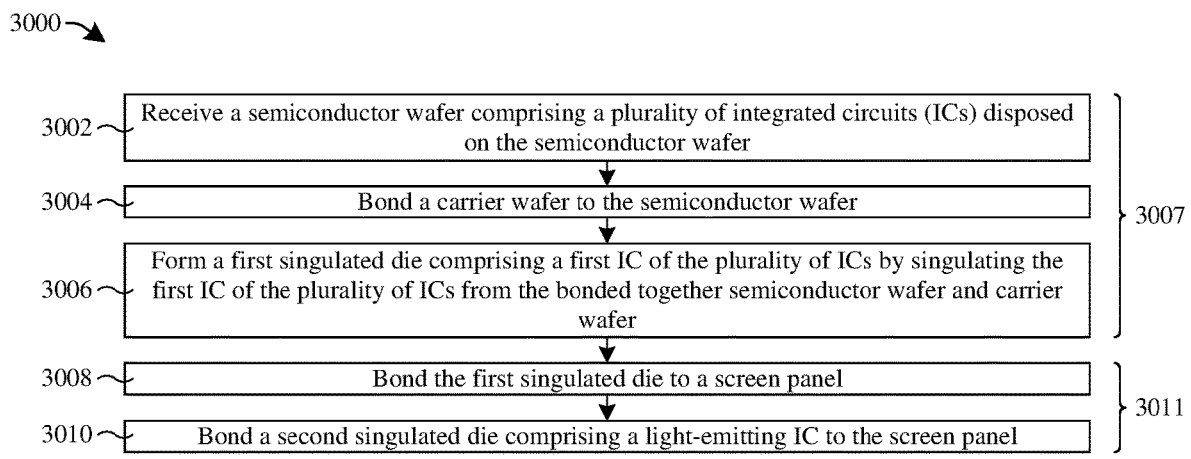
FIG. 30 illustrates a flowchart of some embodiments of a method for: (1) forming a singulated die comprising some embodiments of the IC 100 of FIG. 1; and (2) forming a display device comprising the singulated die.

FIG. 30 illustrates a flowchart 3000 of some embodiments of a method for: (1) forming a singulated die comprising some embodiments of the IC 100 of FIG. 1; and (2) forming a display device comprising the singulated die. While the flowchart 3000 of FIG. 30 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 3002, a semiconductor wafer is received comprising a plurality of integrated circuits (ICs) disposed on the semiconductor wafer. FIGS. 26A-26B illustrate various views of some embodiments corresponding to act 3002.

At act 3004, a carrier wafer is bonded to the semiconductor wafer. FIGS. 27A-27B illustrate various views of some embodiments corresponding to act 3004.

At act 3006, a first singulated die comprising a first IC of the plurality of ICs is formed by singulating the first IC of the plurality of ICs from the bonded together semiconductor wafer and carrier wafer. FIGS. 28A-28B illustrate various views of some embodiments corresponding to act 3006. In some embodiments, the method 3007 for forming a singulated die comprising some embodiments of the IC of FIG. 1 comprises act 3002, act 3004, and act 3006.

At act 3008, the first singulated die is bonded to a screen panel. FIG. 29 illustrates a cross-sectional view of some embodiments corresponding to act 3008.

At act 3010, a second singulated die comprising a light-emitting IC is bonded to the screen panel. FIG. 29 illustrates a cross-sectional view of some embodiments corresponding to act 3010. In some embodiments, the method 3011 for forming a display device comprising the singulated die comprises act 3008 and act 3010.

In some embodiments, the present application provides a method for forming an integrated circuit (IC). The method comprises receiving a workpiece comprising an interconnect structure embedded in an interlayer dielectric (ILD) structure and comprising a first dielectric layer disposed over the ILD structure and the interconnect structure. A first dielectric structure is formed over the workpiece. A sidewall barrier structure is formed over the first dielectric layer and along inner sidewalls of the first dielectric structure. A hardmask structure is formed over the first dielectric layer and along inner sidewalls of the sidewall barrier structure, wherein a height of the hardmask structure is less than a height of the first dielectric structure. After the hardmask structure is formed, an upper portion of the sidewall barrier structure is removed so that a height of the sidewall barrier structure is less than or equal to the height of the hardmask structure. A portion of the first dielectric layer that is disposed between the inner sidewalls of the sidewall barrier structure is removed to form a second dielectric structure. A lower bumping structure is formed over the ILD structure and extending vertically along inner sidewalls of the second dielectric structure and along the inner sidewalls of the sidewall barrier structure. An upper bumping structure is formed over both the lower bumping structure and the sidewall barrier structure.

In some embodiments, the present application provides an integrated circuit (IC). The IC comprises an interlayer dielectric (ILD) structure disposed over a semiconductor substrate, wherein an interconnect structure is embedded in the ILD structure. A first dielectric structure is disposed over the ILD structure and the interconnect structure, wherein a conductive pad of the interconnect structure is at least partially disposed between first inner sidewalls of the first dielectric structure. A second dielectric structure is disposed over the first dielectric structure, wherein the first inner sidewalls are disposed between second inner sidewalls of the second dielectric structure. A sidewall barrier structure is disposed over the first dielectric structure and extends vertically along the second inner sidewalls. A lower bumping structure is disposed over the conductive pad and between the second inner sidewalls, wherein the lower bumping structure extends vertically along the first inner sidewalls and along third inner sidewalls of the sidewall barrier structure. An upper bumping structure is disposed over both the lower bumping structure and the sidewall barrier structure, wherein the upper bumping structure extends vertically along the second inner sidewalls, and wherein an uppermost point of the upper bumping structure is disposed at or below an uppermost point of the second dielectric structure.

In some embodiments, the present application provides a method. The method comprises receiving a semiconductor wafer having a plurality of integrated circuits (ICs) disposed on the semiconductor wafer, wherein: a first IC of the plurality of ICs comprises an interlayer dielectric (ILD) structure, a dielectric structure disposed over the ILD structure, and a bumping structure disposed over the ILD structure and between inner sidewalls of the dielectric structure; the bumping structure comprises a lower bumping structure and an upper bumping structure; a sidewall barrier structure is disposed along outer sidewalls of the lower bumping structure and at least partially separates the lower bumping structure from the inner sidewalls of the dielectric structure; an uppermost surface of the sidewall barrier structure is substantially co-planar with an uppermost surface of the lower bumping structure; and the upper bumping structure is disposed over both the lower bumping structure and the sidewall barrier structure. A carrier wafer is bonded to the semiconductor wafer by bonding the carrier wafer to the dielectric structure or the bumping structure. A first singulated die comprising the first IC is formed by singulating the first IC from the bonded together semiconductor wafer and carrier wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
   an interlayer dielectric (ILD) structure disposed over a semiconductor substrate, wherein an interconnect structure is embedded in the ILD structure;
   a first dielectric structure disposed over the ILD structure and the interconnect structure, wherein a conductive pad of the interconnect structure is at least partially disposed between first inner sidewalls of the first dielectric structure;
   a second dielectric structure disposed over the first dielectric structure, wherein the first inner sidewalls are disposed between second inner sidewalls of the second dielectric structure;
   a sidewall barrier structure disposed over the first dielectric structure and extending vertically along the second inner sidewalls;
   a lower bumping structure disposed over the conductive pad and between the second inner sidewalls, wherein the lower bumping structure extends vertically along the first inner sidewalls and along third inner sidewalls of the sidewall barrier structure; and
   an upper bumping structure disposed over both the lower bumping structure and the sidewall barrier structure, wherein the upper bumping structure extends vertically along the second inner sidewalls, and wherein an uppermost point of the upper bumping structure is disposed at or below an uppermost point of the second dielectric structure.

2. The IC of claim 1, wherein:
   the sidewall barrier structure is titanium nitride;
   the lower bumping structure is nickel; and
   the upper bumping structure is gold.

3. The IC of claim 1, wherein an uppermost surface of the upper bumping structure is not disposed over an uppermost surface of the second dielectric structure.

4. The IC of claim 1, wherein:
   an uppermost surface of the sidewall barrier structure is substantially planar.

5. The IC of claim 4, wherein:
the third inner sidewalls are arced;
one of the third inner sidewalls arc toward an outer sidewall of the sidewall barrier structure from a lowermost surface of the sidewall barrier structure to the uppermost surface of the sidewall barrier structure; and
the one of the third inner sidewalls and the outer sidewall of the sidewall barrier structure are both disposed on a same side of the lower bumping structure.

6. The IC of claim 1, wherein:
an uppermost surface of the sidewall barrier structure is disposed between an uppermost surface of the second dielectric structure and a lowermost surface of the second dielectric structure.

7. The IC of claim 6, wherein:
an uppermost surface of the lower bumping structure and the uppermost surface of the sidewall barrier structure are substantially co-planar; and
an uppermost surface of the upper bumping structure is disposed below the uppermost surface of the second dielectric structure.

8. The IC of claim 6, wherein:
an uppermost surface of the lower bumping structure is disposed below the uppermost surface of the sidewall barrier structure; and
an uppermost surface of the upper bumping structure and the uppermost surface of the second dielectric structure are substantially co-planar.

9. The IC of claim 6, wherein:
an uppermost point of the lower bumping structure is disposed over the uppermost surface of the sidewall barrier structure.

10. The IC of claim 9, wherein:
an uppermost surface of the lower bumping structure has a first concave portion and a first ring-shaped portion; and
the first ring-shaped portion extends laterally around the first concave portion in a first continuous path.

11. The IC of claim 10, wherein:
an uppermost surface of the upper bumping structure has a second concave portion and a second ring-shaped portion; and
the second ring-shaped portion extends laterally around the second concave portion in a second continuous path.

12. An integrated chip (IC), comprising:
a first dielectric structure disposed over a semiconductor substrate;
a conductive pad disposed in the first dielectric structure;
a second dielectric structure overlying the first dielectric structure, wherein the conductive pad is at least partially disposed laterally between opposite inner sidewalls of the second dielectric structure;
a third dielectric structure overlying the second dielectric structure, wherein the opposite inner sidewalls of the second dielectric structure are disposed laterally between opposite inner sidewalls of the third dielectric structure;
a sidewall barrier structure overlying an upper surface of the second dielectric structure, wherein the sidewall barrier structure has an uppermost surface that is substantially planar, and wherein the uppermost surface of the sidewall barrier structure is disposed vertically between the upper surface of the second dielectric structure and an uppermost surface of the third dielectric structure;
a lower bumping structure overlying the conductive pad and disposed laterally between the opposite inner sidewalls of the second dielectric structure, wherein the upper surface of the second dielectric structure is disposed vertically between an upper surface of the lower bumping structure and an upper surface of the conductive pad; and
an upper bumping structure overlying both the upper surface of the lower bumping structure and the uppermost surface of the sidewall barrier structure, wherein the upper bumping structure extends vertically from the upper surface of the lower bumping structure toward the uppermost surface of the third dielectric structure.

13. The IC of claim 12, wherein an uppermost surface of the upper bumping structure is substantially planar.

14. The IC of claim 12, wherein the sidewall barrier structure contacts the opposite inner sidewalls of the third dielectric structure.

15. The IC of claim 14, wherein the sidewall barrier structure contacts the upper surface of the second dielectric structure.

16. The IC of claim 15, wherein the upper bumping structure contacts the uppermost surface of the sidewall barrier structure.

17. The IC of claim 15, wherein the lower bumping structure contacts the uppermost surface of the sidewall barrier structure.

18. An integrated chip (IC), comprising:
a first dielectric structure disposed over a semiconductor substrate;
a conductive pad disposed in the first dielectric structure;
a second dielectric structure disposed over the first dielectric structure and the conductive pad, wherein the conductive pad is partially disposed between opposite inner sidewalls of the second dielectric structure;
a third dielectric structure disposed over the second dielectric structure, wherein the opposite inner sidewalls of the second dielectric structure are disposed laterally between opposite inner sidewalls of the third dielectric structure;
a sidewall barrier structure overlying the second dielectric structure and disposed laterally between the opposite inner sidewalls of the third dielectric structure, wherein the sidewall barrier structure has an uppermost surface that is disposed vertically between an uppermost surface of the third dielectric structure and a lowermost surface of the third dielectric structure;
a lower bumping structure overlying the conductive pad, wherein the lower bumping structure is disposed laterally between the opposite inner sidewalls of the second dielectric structure and laterally between opposite inner sidewalls of the sidewall barrier structure;
an upper bumping structure overlying both the lower bumping structure and the sidewall barrier structure, wherein the upper bumping structure extends vertically from the lower bumping structure toward the uppermost surface of the third dielectric structure; and
a transparent screen panel overlying the third dielectric structure, the sidewall barrier structure, the lower bumping structure, and the upper bumping structure.

19. The IC of claim 18, wherein one or more conductive features are disposed in the transparent screen panel.

20. The IC of claim 18, wherein:
the sidewall barrier structure has a first chemical composition;

the lower bumping structure has a second chemical composition different than the first chemical composition; and the upper bumping structure has a third chemical composition different than both the first chemical composition and the second chemical composition.

\* \* \* \* \*